(12) United States Patent
Martin et al.

(10) Patent No.: US 8,386,223 B2
(45) Date of Patent: Feb. 26, 2013

(54) METHOD FOR SELECTING AN OPTIMIZED TIRE CONFIGURATION FOR A ROAD VEHICLE SUCH AS A RACING CAR OR MOTORCYCLE

(75) Inventors: Hervé Martin, Zurich (CH); Tony Zivkovic, Clermont-Ferrand (FR)

(73) Assignee: Michelin Recherche et Technique S.A., Granges-Paccot (CH)

( * ) Notice: Subject to any disclaimer, the term of this patent is extended or adjusted under 35 U.S.C. 154(b) by 841 days.

(21) Appl. No.: 12/521,430

(22) PCT Filed: Dec. 20, 2007

(86) PCT No.: PCT/FR2007/002141
§ 371 (c)(1),
(2), (4) Date: Aug. 25, 2009

(87) PCT Pub. No.: WO2008/096068
PCT Pub. Date: Aug. 14, 2008

(65) Prior Publication Data
US 2010/0318335 A1    Dec. 16, 2010

(30) Foreign Application Priority Data
Dec. 26, 2006 (FR) ...................... 06 11362

(51) Int. Cl.
*G06G 7/48* (2006.01)
(52) U.S. Cl. ............................................... 703/8; 703/6

(58) Field of Classification Search .................. 703/6, 8; 701/25
See application file for complete search history.

(56) References Cited

U.S. PATENT DOCUMENTS

| | | | |
|---|---|---|---|
| 6,266,601 B1* | 7/2001 | Soga et al. ...................... 701/74 |
| 6,430,993 B1* | 8/2002 | Seta ................................. 73/146 |
| 2002/0050317 A1* | 5/2002 | Iwasaki et al. ................. 156/123 |
| 2004/0068391 A1 | 4/2004 | Futamura et al. |
| 2006/0282197 A1 | 12/2006 | Schoggl |

FOREIGN PATENT DOCUMENTS

| | | |
|---|---|---|
| EP | 0 892 263 | 1/1999 |
| EP | 1 516 751 | 3/2005 |
| EP | 1 627 751 | 2/2006 |

* cited by examiner

*Primary Examiner* — Kamini S Shah
*Assistant Examiner* — Luke Osborne
(74) *Attorney, Agent, or Firm* — Cozen O'Connor

(57) ABSTRACT

A method for selecting, from a set of possible configurations, an optimized tire configuration for fitting a vehicle intended to run on a circuit following a predefined route, oriented in a single course direction and including bends. The method includes the steps of developing a physical model of the vehicle fitted with a first tire configuration, simulating the route course by the modeled vehicle, optimizing the speed of the vehicle, storing in memory the course time taken by the vehicle to cover the route at least once, comparing the course time to at least one reference time and producing a comparison result, and optionally selecting the first configuration at the optimized configuration as a function of the comparison result.

14 Claims, 16 Drawing Sheets

METHOD FOR SELECTING AN OPTIMIZED TIRE CONFIGURATION FOR A ROAD VEHICLE SUCH AS A RACING CAR OR MOTORCYCLE

RELATED APPLICATIONS

This is a U.S. national stage under 35 USC §371 of application No. PCT/FR2007/002141, filed on Dec. 20, 2007.

This application claims the priority of French application no. 06/11362 filed Dec. 26, 2006, the content of which is hereby incorporated by reference.

FIELD OF THE INVENTION

The invention relates generally to techniques associated with motor vehicle tire fitting.

More specifically, the invention relates to a method for selecting, from a set of possible configurations, an optimized tire configuration for fitting a vehicle intended to run on a circuit following a predefined route, oriented in a single course direction and including bends.

BACKGROUND OF THE INVENTION

This selection, which is conventionally performed on the basis of tests and results of experiments, currently represents considerable investments in terms of time and money.

Nevertheless, even when it is possible to make these investments, this selection method involves the drawback that it can only be used after the tires used for the tests have been manufactured.

SUMMARY OF THE INVENTION

One object of the present invention is to provide a selection method free from this constraint.

This and other objects are attained in accordance with one aspect of the present invention directed to a method for selecting, from a set of possible configurations, an optimized tire configuration for fitting a vehicle intended to run on a circuit following a predefined route, oriented in a single course direction and including bends, said method comprising the steps of:

developing a physical model of the vehicle fitted with a first tire configuration;

dividing a digital image of the route into successive segments by connecting at points with associated vehicle speed limit values;

simulating, in iterations, the course by the modeled vehicle, of each route segment, firstly at maximum acceleration on portions of route taken successively in the actual course direction and belonging to a first segment portion including an initial point of said segment, and at maximum deceleration on route portions taken successively upstream from each other and belonging to a second segment portion including an end point of said segment, and connecting the first and second segment portions at a point of the segment where the speed of the modeled vehicle on the first portion of said segment does not exceed the speed of the modeled vehicle on the second portion of said segment;

storing in memory the course time taken by the vehicle to cover the route at least once;

comparing the course time to at least one reference time and producing a comparison result; and optionally selecting the first configuration at the optimized configuration as a function of the comparison result.

In a preferred embodiment of the invention, the vehicle model includes a thermomechanical model of the tires fitted in the vehicle.

This method may particularly comprise the steps consisting of:

(a) inventorying a set of physical parameters tending to limit the speed adopted by the vehicle on the route, said set comprising constant parameters and dynamic parameters, said parameters being linked with the different possible tires, vehicle chassis and/or driving conditions, and including a digital image of the route, consisting of digitized coordinates of successive points of said route;

(b) developing a tire model describing the physical behavior of each tire and involving a first subset of the set of physical parameters;

(c) developing a vehicle model involving both the tire model and a second subset of the set of physical parameters, and describing the physical behavior of the vehicle as a function at least of tire stresses, said stresses comprising slips and drifts;

(d) dividing the digital image of the route into adjacent successive segments in the course direction, each comprising a set of at least three route points including an initial point and an end point of said segment in succession in this order in the course direction, the end point being located in an incoming bend;

(e) respectively associating vehicle speed limit values with the initial and end points of each segment;

(f) selecting, as the active configuration, a first tire configuration;

(g) selecting, as the active segment, a first route segment;

(h) simulating, by means of the vehicle model, the course of at least a first portion of the active route segment, from the initial point thereof, by the vehicle fitted with the active tire configuration, by optimizing the tire stresses to maximize the acceleration applied to the vehicle from the limit speed associated with the initial point of said active segment;

(i) storing in memory the vehicle speeds with the various points of the first portion of the active segment and the course times between said different points;

(j) selecting, as the active section of the active segment, the route portion defined between a first and second point of a pair of points of the active segment in succession in this order in the course direction, the second point of said pair consisting of the end point of the active segment;

(k) selecting, as the target speed, the limit speed associated with the second point of the active section;

(l) simulating, by means of the vehicle model, the course of the active section of the active segment by the vehicle fitted with the active tire configuration, by optimizing the tire stresses and the speed adopted by the vehicle at the first point of the active section to reach the second point of the active section at the target speed, while minimizing the course time on said active section;

(m) storing in memory the course time of the active section by the vehicle; storing in memory, as the limit speed, the vehicle speed at the first point of the active section; and storing in memory, as an element of a second portion of the active segment, the active section covered;

(n) verifying whether the vehicle limit speed at the first point of the active section exceeds the speed stored in memory in step (i) or not, which is adopted at the same point by the vehicle during the course of the first portion of the active segment;

(o) if this is not the case, selecting, as a new active section of the active segment, a route portion located upstream, with respect to the course direction, from the chronologically previous active section, and defined between a first and a second point of a pair of points of the active segment in succession in this order in the course direction, the second point of said pair consisting of the first point of the chronologically previous active section, and repeating steps (k) to (n);

(p) if this is the case, storing in memory, as the total course time of the active segment, the sum of the total course time on the second part of said active segment and the course times stored in memory on the fraction of the first portion of said segment not overlapping with the second portion;

(q) selecting, as the new active segment, the route segment following the previously active segment in the course direction;

(r) repeating steps (h) to (q) until the route is covered at least once and a cumulative and stabilized course time by the vehicle is obtained.

It is possible to envisage that the reference time is obtained by applying the method according to the invention to another tire configuration, in which case the method further comprises steps consisting of:

(s) selecting, as the new active configuration, a second tire configuration;

(t) repeating steps (g) to (r);

(u) comparing the cumulative and stabilized route times, respectively obtained with the first and second tire configuration; and (v) selecting, as the optimized configuration, the tire configuration resulting in the shortest cumulative and stabilized course time of the route, the course time obtained with each tire configuration thus serving as the reference time for the course time obtained with the other tire configuration.

If the tire model is a thermomechanical model, it is possible to envisage that step (j) is preceded by a step (w0) consisting of selecting, as active thermal conditions, predefined thermal conditions, that step (l) is performed by applying the active thermal conditions to the tires, that step (m) includes the further basic operation consisting of storing in memory the tire stresses on each active section, and that step (p) is immediately preceded by an iteration loop comprising steps consisting of:

(w1) in the event of a successful verification performed in step (n), simulating by means of the vehicle model the course by said vehicle fitted with the active tire configuration, active section after active section in the course direction, of the second portion of the active segment, by applying to the tires on each active section the stresses stored in memory in step (m) for said active section, and deducing new thermal conditions of use of the tires on the second portion of the active segment;

(w2) verifying whether the difference between the new thermal conditions and the active thermal conditions is within a convergence limit or not; and (w3) if this is not the case, storing in memory, as the active thermal conditions, the new thermal conditions and repeating steps (j) to (w2).

Step (d) may be implemented by setting the end point of each segment to the maximum curvature of a bend, and the method according to the invention may comprise a further operation, implemented for each new course of the route and consisting of moving the end point of each segment upstream, in the direction of a zone having less tire slip.

The method according to the invention may be optimized by envisaging that the tire model developed in step (b) and used in each simulation step (h, l, w1) describes the physical behavior of each tire fitted on the vehicle when driving on the ground, wherewith the tire tread has a contact area including at least one adherent contact zone and at least one slippery contact zone, that step (b) comprises at least modeling operations, that each simulation step (h, l, w1) comprises digital value allocation operations and resolution operations, that the modeling operations consist at least of defining, by applying physical laws that are known and/or constructed by specific experimentation, and as the first model, a model of the longitudinal forces, transversal forces and a self-alignment torque, transmitted by the tire between the ground and the vehicle, as a function of specific physical parameters, including an adherence coefficient and a shear modulus of the tire rubber, and as a function of dynamic parameters associated with the physical driving and usage conditions of the tire, the self-alignment torque being linked with the intensity of the longitudinal and transversal forces and the distribution thereof in the contact area, by envisaging that the allocation operations consist at least of attributing digital values to the dynamic parameters and the specific parameters, and that the resolution operations consist at least of deducing, using at least the first model and the values attributed to the dynamic parameters and the specific physical parameters, the values of the longitudinal forces, transversal forces, and the self-alignment torque, by envisaging that the modeling operations also comprise the definition, as the second model, of a local heating model expressing variations of a contact temperature of the tread with the ground from the entrance to the exit of the contact area following contact and slip of the tread with the ground, and the definition, as the third model, of an overall heating and thermal flow model, said third model expressing variations, over a period of at least one revolution, of a peripheral temperature of the tread and an internal temperature of the tire as a function of previously known or estimated values of the peripheral and internal temperatures, a thermal conduction coefficient of the tread, and thermodynamic component phenomena such as internal deformations experienced by the tire, heat exchanges between the tire and the environment thereof, and slip of the tread on the ground, and envisaging that at least the adherence coefficient and the shear modulus are involved in the first model as variables or functions of the peripheral temperature and internal temperature, that the peripheral temperature value, obtained by means of resolution operations relating to the third model, is used by resolution operations relating to the second model to account for the temperature dependency of the adherence coefficient, and that the internal temperature value, obtained by means of resolution operations relating to the third model, is used by resolution operations relating to the first model to account for the temperature dependency of the shear modulus of the tire rubber.

Advantageously, it is envisaged that the first model developed in step (b) comprises equations associated with the equilibrium conditions of the basic shearing and slipping forces of the tread in the contact area, that each simulation step (h, l, w1) comprises at least one iterative calculation phase consisting of a succession of calculation cycles, and that each calculation cycle comprises at least one resolution operation relating to the second model.

The method according to the invention, in a preferred embodiment, may be implemented by envisaging in step (b) that the first model is defined by considering that the contact area comprises a single adherent contact zone and a single slippery contact zone separated from each other by a transition point, that the first model takes the form of a system of equations expressed at least as a function of the dynamic parameters, specific parameters, and the abscissa of the transition point, that each iterative phase is dedicated to phenomena occurring during a corresponding basic time interval, and that each iterative phase is implemented to resolve, by means of successive approximations and at least on the basis of previously known or estimated values of the abscissa of the transition point, transversal forces, and the self-alignment torque, new values of the abscissa of the transition point, transversal forces, and the self-alignment torque which resolve the system of equations of the first model for the value attributed to the dynamic parameters and the specific parameters, with the result that the longitudinal forces, transversal forces, and the self-alignment torque of the tire may be calculated in real time during the driving of the vehicle.

In this case, each new calculation cycle of each iterative phase preferentially comprises the operations consisting at least of:

calculating a new provisional value of the abscissa of the transition point on the basis of the equilibrium equations of the basic forces and the previously known or estimated values of the transversal forces and the self-alignment torque;

calculating, on the basis of the new provisional value of the abscissa of the transition point and the equations linking the transversal forces and the self-alignment torque with the dynamic parameters, specific parameters, and the abscissa of the transition point, new values of the transversal forces and the self-alignment torque that can be used for any subsequent calculation cycle;

conditionally interrupting said iterative phase at least when the difference between the new provisional value of the abscissa of the transition point and the previously known or estimated value of said abscissa is less than a predefined limit of precision; and when said iterative phase is interrupted, assigning the transversal forces and the self-alignment torque, as the values for this phase, the new values of the transversal forces and the self-alignment torque obtained in the final calculation cycle.

Furthermore, each simulation step (h, l, w1) of the vehicle involved in the method according to the invention advantageously comprises an implementation operation after the end of each iterative phase and consisting of at least updating the dynamic parameters to account for the variations experienced by said parameters during the iterative phase execution time, and initiating a new iterative phase.

Furthermore, the resolution operations relating to the third model are preferentially performed outside each iterative phase.

Each iterative phase may be preceded by a preparatory phase during which contingent quantities are calculated, including the contact area dimensions, as a function of the values attributed to dynamic parameters and the specific parameters, each contingent quantity being processed in said iterative phase with a value attributed during the preparatory phase.

In order to model the vehicle overall, it is possible to envisage that each of the first, second and third models are processed for each tire and associated with a dynamic chassis model, that the chassis model provides the first, second and third models, for each tire, with the values of at least some of the dynamic parameters, and that the chassis model processes, for each tire, the values of the longitudinal forces, transversal forces and the self-alignment torque obtained using the first, second and third models.

BRIEF DESCRIPTION OF THE DRAWINGS

Other features and advantages of the invention will emerge clearly from the description hereinafter, which is given as an indication and is in no way limitative, with reference to the appended figures, wherein.

DETAILED DESCRIPTION OF THE DRAWINGS

As mentioned above, the invention relates to a method for selecting, from a set of possible configurations, an optimized tire configuration for fitting a vehicle.

Figure 1:
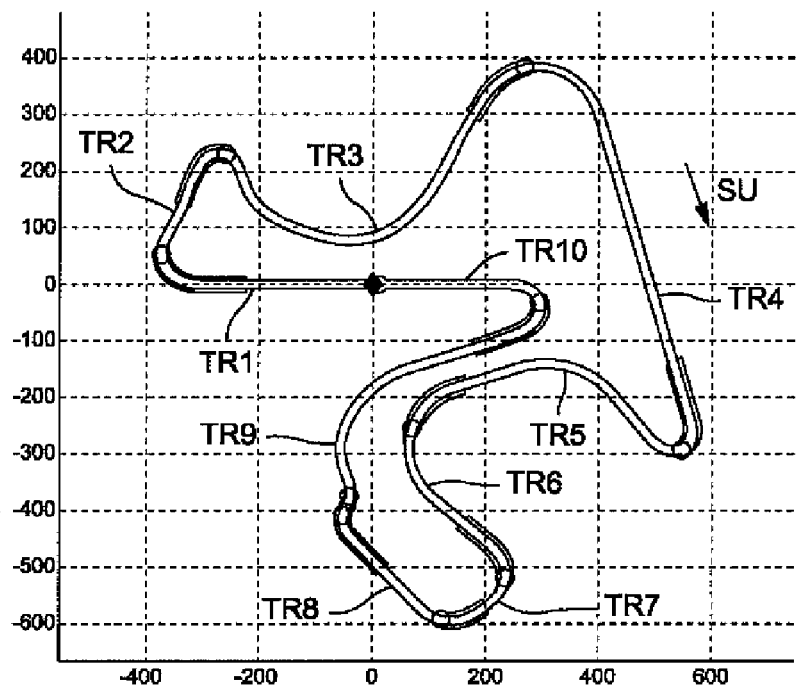
FIG. 1 is a schematic view of an example of a possible route, consisting of the Jerez motor racing circuit.

The invention particularly applies to the tire fitting of a racing vehicle intended to run on a circuit as illustrated in FIG. 1 along a predefined route, said route being oriented in a single course direction SU and including bends.

This method requires the development of a physical model of the vehicle fitted with a tire configuration, involving modeling of said tires and enabling a simulation of the vehicle fitted with said tires.

Once the tire and vehicle models are available, the method according to the invention performs a route course simulation by the modeled vehicle, wherein the vehicle speed is optimized.

The course time taken by the vehicle to cover the route at least once is then stored in memory and compared to a reference time.

In this way, it is possible, as a function of the result of this comparison, to evaluate the tire configuration used in the simulation with respect to a reference, and therefore classify said configuration as being optimized or not with respect to the reference.

This reference may in turn consist of a tire configuration fitted in a simulated vehicle, such that two different tire configurations may serve as a reference for each other.

In the preferred embodiment of the invention, the model used for the tires is a thermomechanical model, the simulation thus possibly achieving a high degree of realism.

A detailed example of an embodiment of the method according to the invention is given hereinafter in the most comprehensive case, wherein the reference consists of a tire configuration subject to a simulation, and wherein the tire model is a thermomechanical model.

Figure 2:
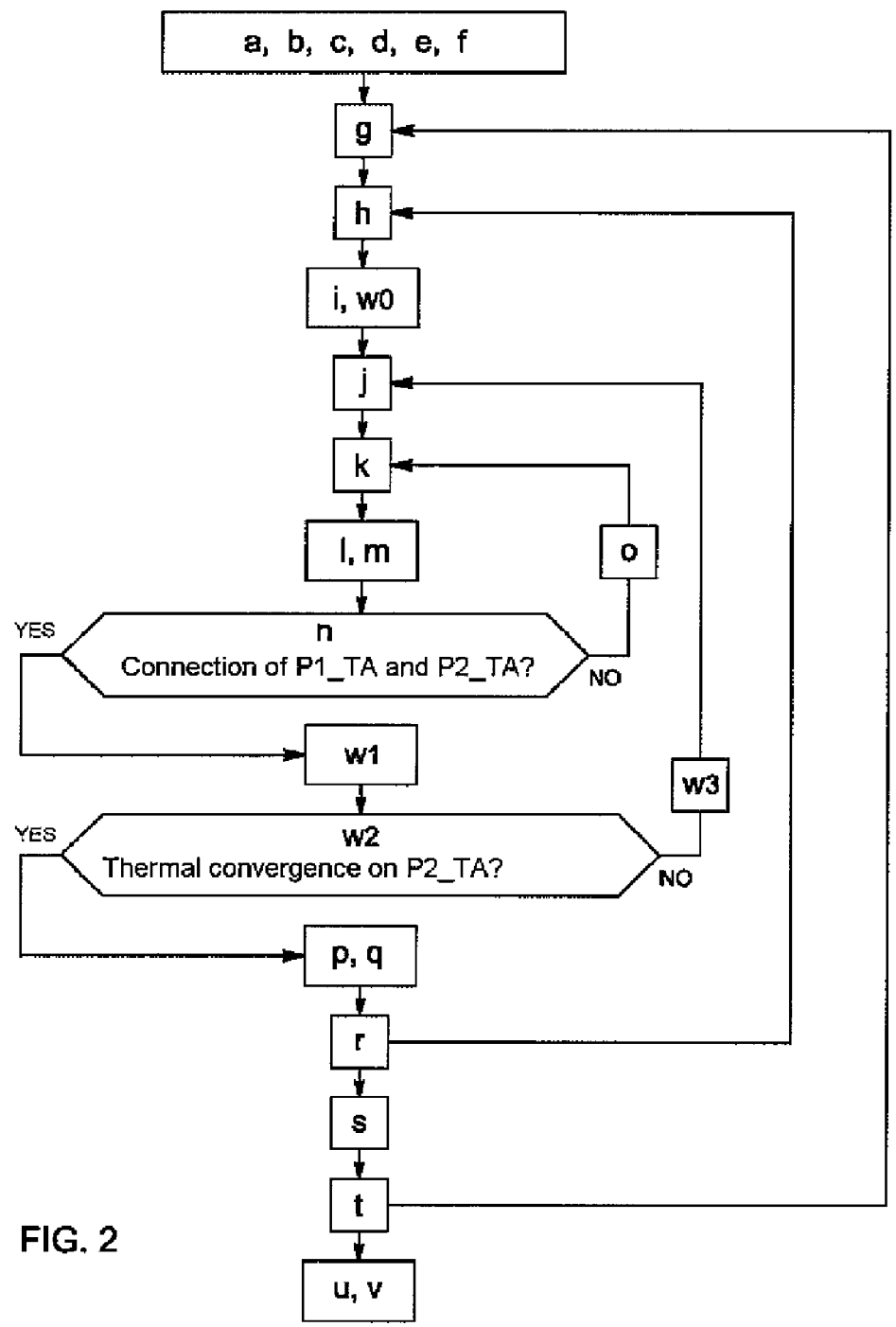
FIG. 2 is a flow chart illustrating the overall operative organization of the method according to the invention.

Such a method typically comprises the following steps (FIG. 2).

(a) Step (a) consists of inventorying the set of physical parameters having an influence, particularly in terms of a reduction, on the speed that may be adopted by the vehicle on the route. This set of parameters comprises parameters associated with the various possible tires, the vehicle chassis and/or the driving conditions, and includes constant parameters and dynamic parameters. In particular, the subset of constant parameters associated with the driving conditions comprises a digital image of the route, consisting of digitized coordinates of successive points of said route, such as the points P11 or P23 that can be seen in FIG. 3.

(b) Step (b) consists of developing a tire model describing the physical behavior of each tire as a function of the relevant physical parameters, and particularly as a function of the temperature. Possible content of step (b) is described in detail in the section entitled "Tire modeling and simulation".

(c) Step (c) consists of developing a vehicle model fitted with tires. Possible content of step (c) is described in detail in the section entitled "Vehicle modeling and simulation".

(d) Step (d) consists of dividing the digital image of the route into adjacent segments such as TR1, TR2, etc. (FIGS. 1 and 3), said segments being successive in the vehicle route course direction SU. Each segment comprises a plurality of route points regularly spaced from each other, for example with a spacing of 5 meters. Each segment, assumed to be oriented in the course direction SU, starts at an initial point, such as P11 for TR1 and P21 for TR2, and ends with an end point such as P17 for TR1 and P25 for TR2, the end point and the initial point of two adjacent segments, for example P17 and P21 of the segments TR1 and TR2, being merged. Each segment is selected so as to have not more than one bend exit and one entrance of another bend. The end point of each segment is thus located in an incoming bend, and for example selected, by default, at the maximum curvature point of or mid-way through the bend.

(e) Step (e) consists of associating with the initial point and end point of each segment respectively vehicle speed limit values, such as VL11 and VL12. The limit speed V112 at the end point P17 of a segment TR1 and the limit speed VL12 at the initial point P21 of the next segment TR2 are obviously set to the same value in that these points are merged. The limit values are for example selected or estimated on the basis of speeds actually measured in racing.

(f) Step (f) consists of selecting, as the active configuration, a first tire configuration to be tested.

Figure 3:
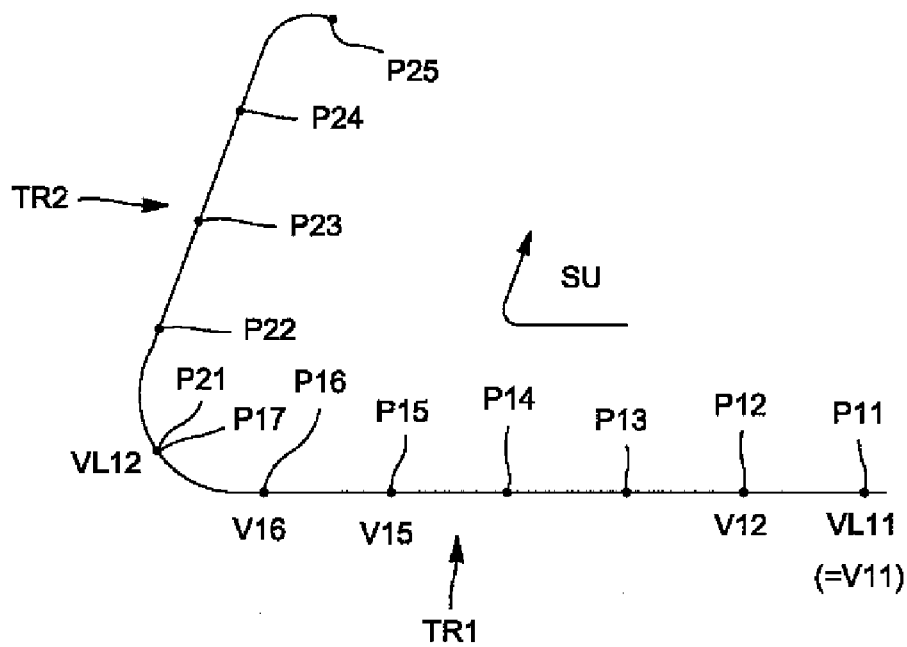
FIG. 3 is an enlarged schematic view of a portion of the circuit illustrated in FIG. 1.

(g) Step (g) consists of selecting, as the active segment, a first route segment to start the simulation, for example the segment TR1 (FIGS. 1 and 3).

(h) Step (h) consists of simulating, by means of the vehicle model developed in step (c), the course of the active segment TR1 or of a first portion at least P1_TA of said active segment (FIG. 4), from the initial point P11 thereof, by the vehicle fitted with the active tire configuration. In fact, this simulation is performed by optimizing the tire stresses so that the vehicle is at maximum acceleration from the limit speed V11 associated with the initial point P11 of said active segment, in this instance, the segment TR1. In that it involves non-linear relationships, this optimization must be performed by means of a suitable tool, such as the SQP sequential quadratic programming algorithm, which is for example available in the software tools sold under the brand "Matlab 7". Although the simulation performed in step (h) may be performed along the entire length of the active segment, in this instance TR1, this is not necessary, which justifies indicating the fact that this simulation is performed "on a first portion at least P1_TA of the active segment". Indeed, the simulation performed in step (h) is devised to simulate the movement of the vehicle at full acceleration. However, in that each segment, with the possible exception of the last, ends with a bend, the vehicle is obliged to abandon the maximum acceleration state thereof before the end of each segment.

(i) Step (i), which is implemented as step (h) progresses, consists of storing in memory the speeds adopted by the vehicle at the various points, such as P11, P12, P13, etc. of the first portion P1_TA of the active segment, in this instance TR1, and the vehicle course times between these different points. The result obtained in this step is equivalent to that illustrated in the diagram in FIG. 4, which represents the vehicle speed passing the various points of the segment, the course times being defined by the ratios of the distance over the speed.

(w0) Step (w0) consists of selecting, as active thermal conditions, predefined thermal conditions. This step, which is used to prepare an iteration loop for calculating, by means of successive approximations, the vehicle braking conditions at the end of the active segment, may be implemented using, by default, the tire temperatures previously measured or estimated on actual vehicles at the different points of the active segment.

(j) Step (j) consists of selecting, as the active section of the active segment, the route portion defined between the penultimate point and the end point of the active segment, i.e. the section between points P16 and P17 when the active segment is TR1 (FIG. 3).

(k) Step (k) consists of selecting, as the target speed, the limit speed associated with the second point of the active section, i.e. the speed VL12 at the point P17 when the active section is that extending between P16 and P17.

(l) Step (l) consists of simulating, by means of the vehicle model, the course of the active section (in this instance from P16 to P17) of the active segment (in this instance TR1) by the vehicle fitted with the active tire configuration. This simulation is performed by applying to the tires the active thermal conditions and by optimizing the tire stresses and the vehicle speed V16 at the first point P16 of the active section to reach the second point P17 of the active section at the target speed VL12, while minimizing the course time on said active section. Therefore, as for step (h), step (l) involves advanced optimization tools which are nevertheless well known to those skilled in the art and commercially available. On the other hand, unlike step (h), step (l) is intended to describe the movement of the vehicle in the deceleration phase.

(m) step (m) consists of performing data storage in an electronic memory, and particularly of storing the course time of the active section (in this instance P16 to 217) by the vehicle, storing in memory, as the limit speed, the vehicle speed V16 at the first point P16 of the active section, storing in memory, as an element of a second portion P2_TA of the active segment (in this instance TR1), the active section P16 to P17 just covered, and storing in memory the tire stresses on said active section. The reference made herein to a "second portion P2_TA" of the active segment is justified by the wish to differentiate said second portion, whereon the vehicle is simulated in deceleration, from the first portion P1_TA whereon the vehicle was simulated in acceleration. Furthermore, as shown symbolically by arrows in FIG. 4, the first portion P1_TA is simulated by progressing from the initial point of the active segment, whereas the second portion P2_TA is simulated by progressing in reverse from the end point of the active segment.

(n) Step (n) consists of verifying whether the vehicle limit speed V16 at the first point P16 of the active section exceeds the speed or not, stored in memory in step (i), adopted at said point P16 by the vehicle during the course of the first portion P1_TA of the active segment. More intuitively, said step consists of testing whether the second portion 2_TA, as covered up to that point, is or is not sufficient to join the first portion P1_TA wherein the characteristics were stored in memory in step (i).

(o) Step (o), which is only implemented in the event of a negative response to the test in step (n), consists firstly of selecting, as the new active section of the active segment, the route portion defined between two consecutive points of the active segment and located immediately upstream from the chronologically previous active section, i.e. in this instance, the section extending from P15 to P16, and repeating steps (k) to (n) by applying same to the new active section P15 to P16.

(w1) Step (w1), which is only implemented in the event of a positive response to the test in step (n), consists of simulating, by means of the vehicle model, the course by said vehicle equipped with the active tire configuration, active section after active section in the course direction SU, of the second portion P2_TA of the active segment, by applying to the tires on each active section the stresses stored in memory in step (m) on this active section, and deducing new thermal conditions of uses of the tires on said second portion P2_TA of the active segment. Therefore, more intuitively, step (w1) consists of covering in the actual direction SU the portion P2_TA of the active segment whereon the vehicle is decelerating, by replaying the tire stresses previously stored in memory to deduce more suitable thermal operating conditions for the specific scenario than the thermal conditions selected by default in step (w0) and previously used in step (l) as initial active thermal conditions.

(w2) Step (w2) consists of verifying whether the difference between the new thermal conditions obtained in step (w1) and the active thermal conditions is within a convergence limit or not. In other words, step (w2) tests whether the new thermal conditions obtained are acceptable, or if it is necessary to fine-tune them further.

Figure 4:
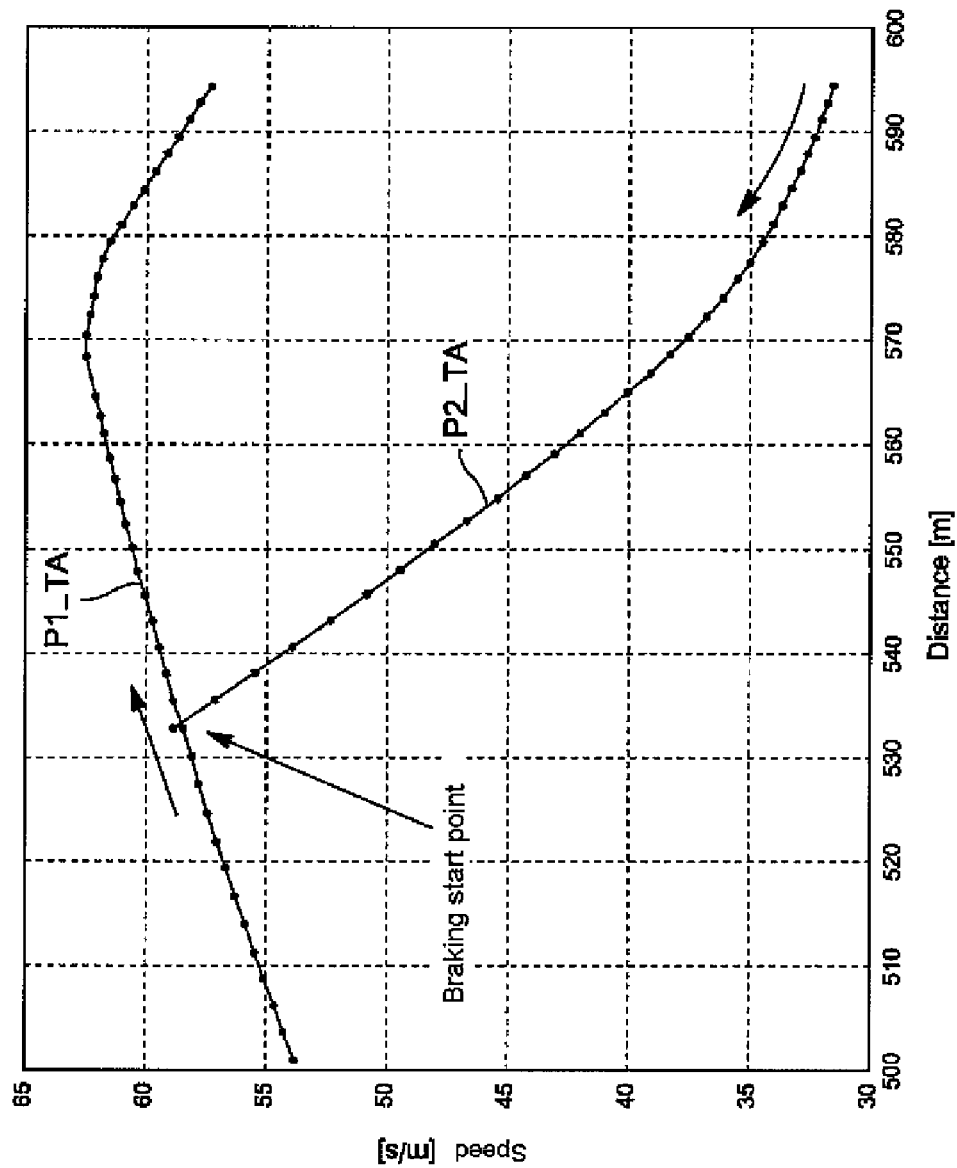
FIG. 4 is a diagram representing, as a function of the distance covered by the vehicle and identified on the abscissa, the speed adopted by said vehicle and identified on the ordinate, firstly for the first portion of an active segment, and secondly for the second portion of said segment.

(w3) Step (w3), which is only implemented if the new thermal conditions are not yet acceptable, consists of storing in memory, as the active thermal conditions, the new thermal conditions obtained in step (w1) and repeating steps (j) to (w2);

(p) Step (p), which is only implemented if the new thermal conditions have converged sufficiently and are therefore acceptable, consists of storing in memory, as the total course time of the active segment (in this instance still TR1), the sum of the total course time on the second portion P2_TA of said active segment and course times stored in memory on the fraction of the first portion P1_TA not overlapping with the second portion, i.e. on the fraction of P1_TA located to the left of the meeting point of P2_TA and P1_TA in FIG. 4.

(q) Step (q) consists of selecting, as the new active segment, the route segment, in this instance TR2, following the previously active segment TR1 in the course direction SU.

(r) Step (r) consists of repeating steps (h) to (q) until the route is covered at least once and a cumulative and stabilized route course time by the vehicle is obtained.

(s) Step (s) consists of selecting, as the new active configuration, a second tire configuration.

(t) Step (t) consists of repeating steps (g) to (r) using the new tire configuration.

(u) Step (u) consists of comparing the cumulative and stabilized route course times, obtained with the first and second tire configurations, respectively.

(v) Step (u) consists of selecting, as the optimized configuration, the tire configuration resulting in the shortest cumulative and stabilized route course time, the course time obtained with each tire configuration thus serving as a reference time for the course time obtained with the other tire configuration.

As specified above, the position of the end point of each segment may be conventionally selected in step (d), said point before for example set to the maximum curvature of the final bend of said segment.

Nevertheless, this conventional position is rarely optimal, drivers tending to reaccelerate the vehicle in a bend before the maximum curvature point.

To optimize the vehicle simulation, the method according to the invention may comprise a further operation, which is implemented for each new route course, and which consists of moving the end point of each segment upstream, toward a zone having lower tire slip.

Tire Modeling and Simulation

This section describes a possible embodiment of step (b) and each step of the method according to the invention which involves simulating the physical behavior of each tire fitted in the vehicle in a driving situation on the ground.

In a tire driving situation on the ground, the tire tread has, with the ground, a contact area formed of at least one adherent contact zone and at least one slippery contact zone.

The purpose of step (b) is to develop the tools making it possible to provide, as a function of a number of quantities of influence, the values of various forces transmitted by each tire between the ground and the vehicle.

The present description section will use the writing conventions hereinafter, which will be specific to tire modeling, and some of which are already commonly used in the existing tire models known to those skilled in the art.

| | |
|---|---|
| $\delta$ | Drift angle |
| $\delta'$ | Drift angle on breaker strips |
| $\alpha_1$ | Plysteer angle |
| $\gamma$ | Angle of inclination (camber) |
| $\tau$ | Longitudinal slip ratio |
| Fx | Longitudinal force |
| Fy | Transversal force |
| Fz | Wheel load |
| V | Ground point speed |
| $W_x$ | Vertex point speed along axis |
| Mz | Self-alignment torque |
| Ny | Component of self-alignment torque associated with force Fy |

| | |
|---|---|
| Nx | Component of self-alignment torque associated with distribution of forces Fx in width of contact area |
| $R_L$ | Lateral tire rigidity |
| $R_{LL}$ | Longitudinal tire rigidity |
| $k_T$ | Tire torsion rigidity |
| $S_2$ | Bending flexibility on breaker strip edge |
| $\mu$ | Dynamic adherence coefficient between tire rubber and ground: $\mu(p, Vg, Ts)$ |
| $\mu_0$ | Static adherence coefficient |
| Lx | Characteristic length of contact area |
| Ly | Width of contact area |
| ent | Tread grooving rate |
| AssX | Longitudinal tread flexibility coefficient |
| AssY | Lateral tread flexibility coefficient |
| G* | Shear modulus of tire tread rubber mixture |
| $e_{KM}$ | Tread thickness |
| a | Half-length of contact area |
| b | Abscissa of start of slip in contact area |
| Ti | Internal temperature profile of rubber, between tire surface and breaker strips |
| Ts | Mean tread surface temperature |
| Tc | Contact temperature at interface between rubber and ground |
| Vg | Slip speed between tire and ground |
| $X_N, Y_N$ | Coordinates of tire vertex points (internal tread zone, at tire base, perpendicular to the contact area |
| $X_k, Y_k$ | Coordinates of tread points on interface with ground |

Figure 5:
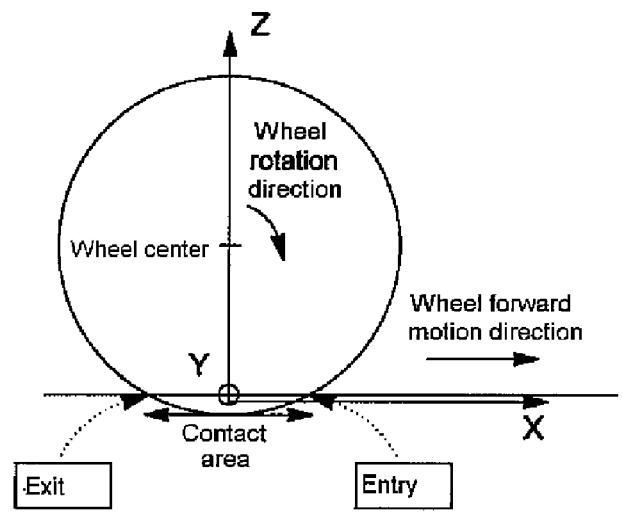
FIG. 5 is a schematic elevation view of a wheel fitted with a tire whereon a tire model that is usable in the method according to the invention is applied.
Figure 6:
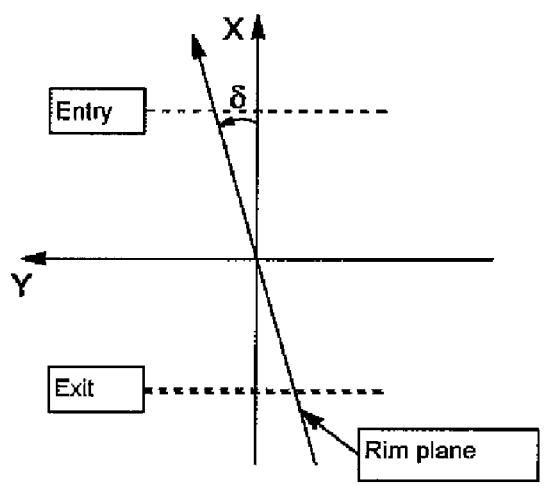
FIG. 6 is an enlarged schematic top view of the contact area of the tire in FIG. 5 with the ground, the tire being in a drift situation with respect to the speed vector (X-axis)
Figure 7:
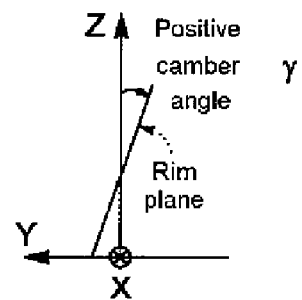
FIG. 7 is a schematic front view of the tire in FIG. 5, the tire being in a camber situation.

FIGS. 5 to 7 specify the reference system used.

This reference system is defined by:

O: the point of origin of the reference at the center of the contact area;

OX: the axis parallel with the speed vector;

OY: the axis perpendicular to OX, parallel with the ground surface irrespective of the camber;

In this reference system, the sign convention requires that: for $\tau>0$, a longitudinal force is generated in the direction of the axis OX; for $\delta>0$, a lateral force is generated in the direction of the axis OY, and for $\gamma>0$, a so-called negative self-alignment torque Mz is generated, inducing a negative lateral thrust (i.e. oriented in the direction opposite OY).

The forces transmitted by the tire between the ground and the vehicle comprise longitudinal forces Fx, transversal forces Fy, and a self-alignment torque Mz, which is linked with the intensity of the longitudinal and transversal forces and the distribution thereof in the contact area.

The quantities of influence typically comprise, firstly, dynamic parameters, i.e. variables at least as a function of time, and linked with the physical driving and usage conditions of the tire, and, secondly, physical parameters which are specific parameters for the tire in question and having a constant value under defined reference conditions.

The dynamic parameters comprise the drift angle, the slip ratio, the camber angle, the load, the speed, the inflation pressure, the air and ground temperatures, the initial tire temperatures and the time.

The specific parameters comprise the dimensions of the contact area (length, width, shape coefficient), the pressure profile p(x) along the contact area, the longitudinal Kx and transversal Ky rigidities of the tread, the rigidities of the tire structure, i.e. the lateral rigidity RL, the longitudinal rigidity RLL, the radial rigidity Rrr, and the torsion rigidity $k_T$, the breaker strip rigidity 1/S2, a rubber/ground pair adherence law $\mu$, length transfer parameters between tire ribs, and are linked with the dynamic parameters by equations constructed by means of specific experimentation which can be expressed using the expressions given hereinafter as examples.

Figure 8:
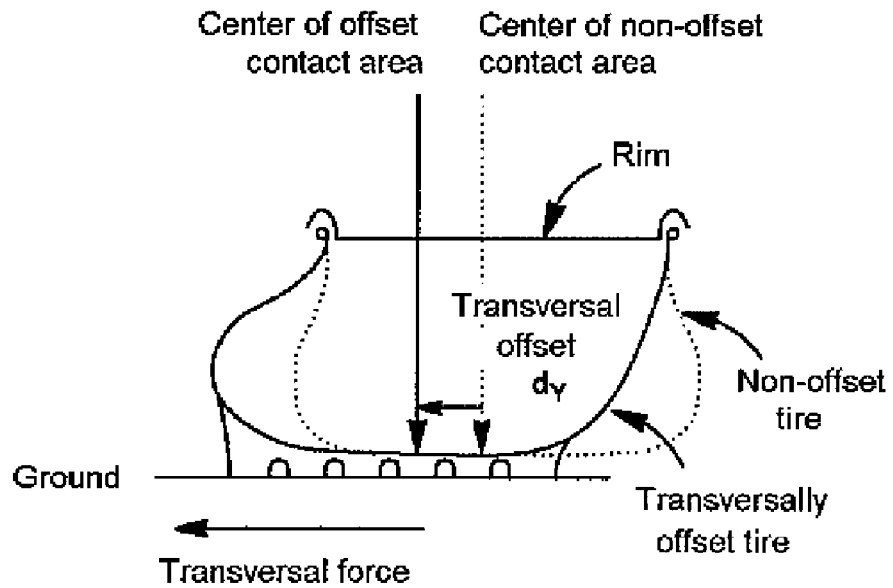
FIG. 8 is a partial schematic and radial section view of a tire represented in two different stress situations.

The lateral rigidity corresponds to an offset dy of the contact area (see FIG. 8) with respect to the wheel plane under the effect of a lateral force:

$$R_L = R_{L0} + R_{Lp}p$$

where $R_{L0}$ [N/m] represents the structural part and $R_{Lp}$ [N/m/bar] the pneumatic part, p being the pressure expressed in bar.

Figure 9:
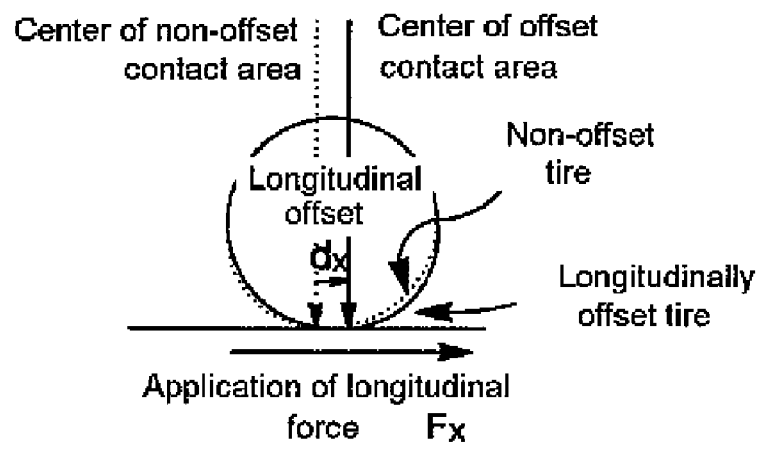
FIG. 9 is a schematic elevation view of a tire represented in two different stress situations.

The longitudinal rigidity corresponds to an offset dx of the contact area (see FIG. 9) along the longitudinal wheel axis in the presence of a longitudinal force Fx:

$$R_{LL} = R_{LL0} + R_{LLp}p$$

where $R_{LL0}$ [N/m] represents the structure part and $R_{LLp}$ [N/m/bar] the pneumatic part, p being the pressure expressed in bar.

Figure 10:
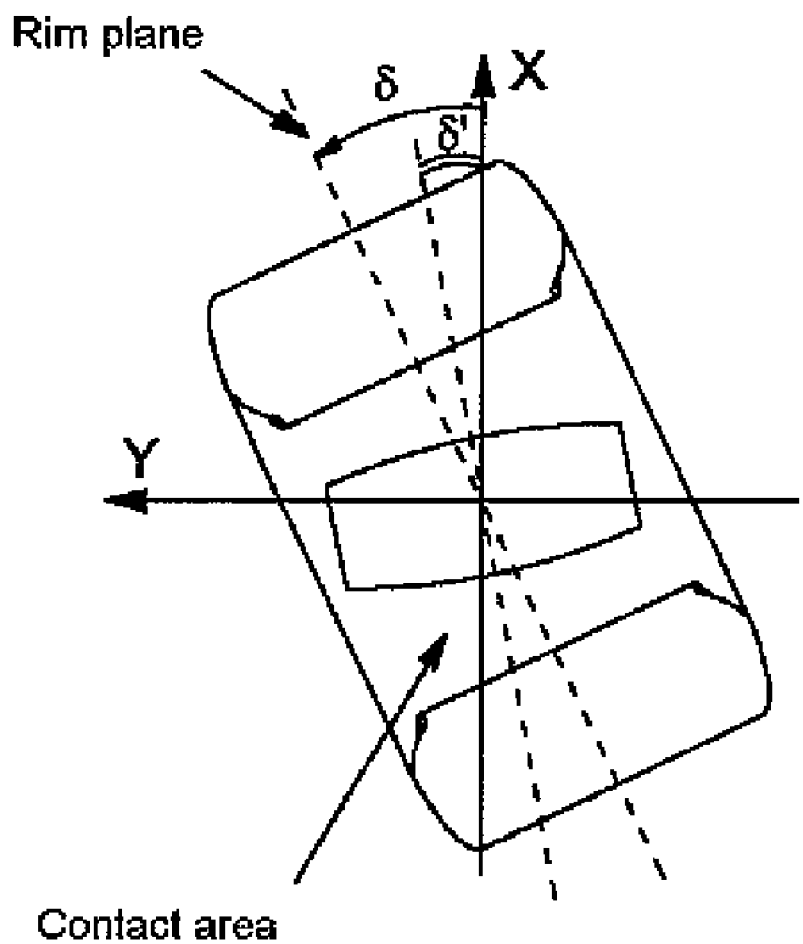
FIG. 10 is a schematic top view of a tire subject to torsion.

The development of the self-alignment torque Mz induces a torsion of an angle $\Delta\delta$ of the casing about the Z axis with respect to the rim surface (see FIG. 10):

$$\Delta\delta = \frac{M_Z}{k_T}$$

The torsion rigidity of the casing contains a structural component $k_{T0}$ [N.m/rad] and a component $k_{TZ}$ [m/rad] which conveys the variation of the torsion rigidity with the load for example taking the form:

$$k_t = (k_{T0} + k_{TZ}F_Z)\sqrt{p}$$

The actual drift angle $\delta'$ adopted by the contact area is expressed as a function of the drift angle on the wheel axis as follows:

$$\delta' = \delta + \frac{M_Z}{k_T}$$

The deformation of the vertex may be modeled using a second degree law with a curvature at the center of the contact area which is expressed for example as follows:

$$\rho = S_2 Fy$$

where $S_2$ is a representative parameter of the edge bending flexibility.

The radial rigidity links the load Fz with the deflection of the vertex with respect to the rim. It is pressure-dependent and is broken down into two terms: a structural term $R_{R0}$ [N/m] corresponding to the radial rigidity of the tire at zero pressure, and a pneumatic term $R_{RP}$ [N/m/bar]:

$$R_R = R_{R0} + R_{Rp}p$$

The length of the contact area is defined by:

$$\boxed{Lx = a\sqrt{\frac{F_Z}{p^c}} + b\frac{F_Z}{p^c}},$$

this formulation making it possible to account for the effect of the load and the inflation pressure.

The width of the contact area is defined by:

$$Ly = Ly_c + 2 \cdot Ly_e$$

where $Ly_c$ is the width of the ribs at the center of the tire and $Ly_c$ the width of the ribs at the shoulders, calculated with the following formula:

$$Ly_e = c \arctan\left[d\left(\frac{F_Z}{p^{0.6}} - e\right)^2\right].$$

The effective surface area of the contact area is defined as the product of the width by the length, weighted by the grooving and a shape coefficient:

$$S_{ADC} = C_{shape} \text{ent } Lx\, Ly$$

The shape coefficient $C_{shape}$ accounts for the shape variation of the contact area as a function of the load.

During the compression of the tire structure, the vertex adopts an inclination $\alpha_1$ which is a characteristic quantity of the structure under study.

The pressure profile between the entrance and the exit of the contact area is determined as follows:

$$p(x) = \frac{2n+1}{2n} \frac{F_Z}{S_{ADC}} \left(1 - \left(\frac{x}{Lx/2}\right)^{2n}\right),$$

This pressure distribution is such that:

$$\int_{-Lx/2}^{Lx/2} p(x)dx = \frac{F_Z}{S_{ADC}}.$$

At a low load, the profile tends to be parabolic (n=1). At a high load, the pressure profile is quasi-uniform.

Preferentially, n is a real number varying linearly with the length of the contact area Lx. To prevent low loads n from being too low (or negative), n is limited less than 1 as follows:

$$n = \max(1, n_a Lx + n_b).$$

The tire model used in the invention preferentially uses at least one mechanical model (first model) combined with a local thermal model (second model) and an overall thermal model (third model).

Each of these models is defined during a preliminary tire modeling phase and takes the form of a system of equations.

These models may be defined in a plurality of ways, and particularly using physical laws known to those skilled in the art, or more or less approximate laws constructed by means of specific experimentation, so that the equations whereby these models are expressed may take a plurality of forms.

Therefore, these models are essentially characterized by the input quantities thereof, the output quantities thereof, and the fact that they each take the form of a system of equations expressing observable physical phenomena as a function of quantifiable physical properties.

The output quantities of the mechanical tire model are the longitudinal forces Fx, the lateral forces Fy, and the self-alignment torque Mz.

The output quantity of the local thermal model is the tread temperature along the contact area.

Also, the output quantities of the overall thermal model of the tire are the mean peripheral or surface temperature Ts of the tread, and the profile of the internal temperature Ti of said tread along the thickness thereof.

Figure 11:
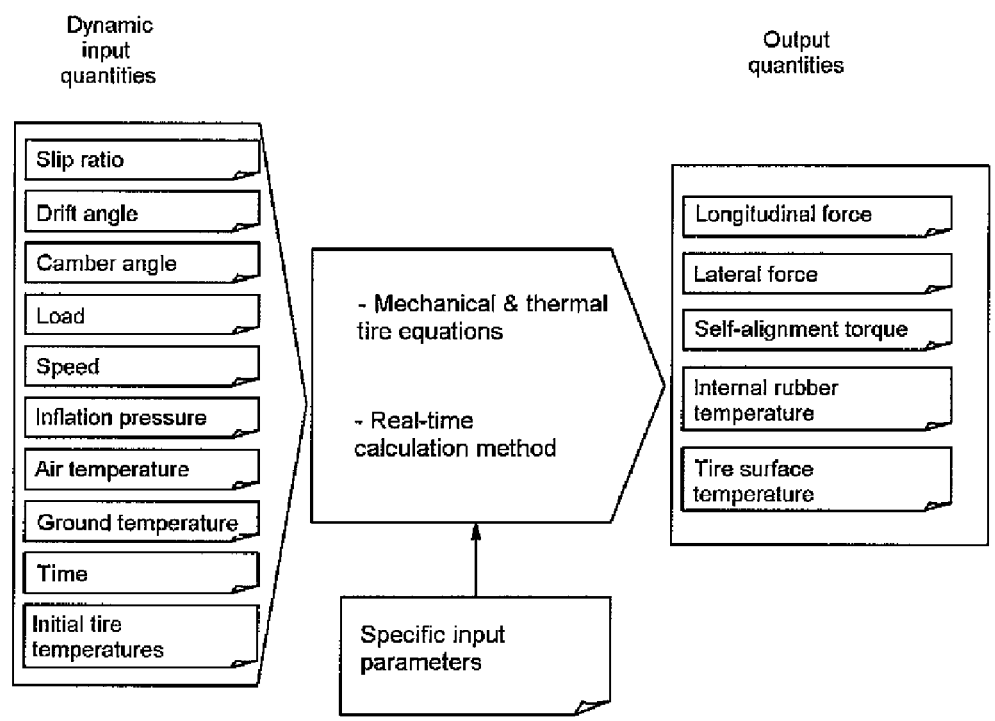
FIG. 11 is a diagram summarizing the various quantities involved in the embodiment of the method according to the invention.

The input and output quantities of all these models are listed in FIG. 11.

Figure 12:
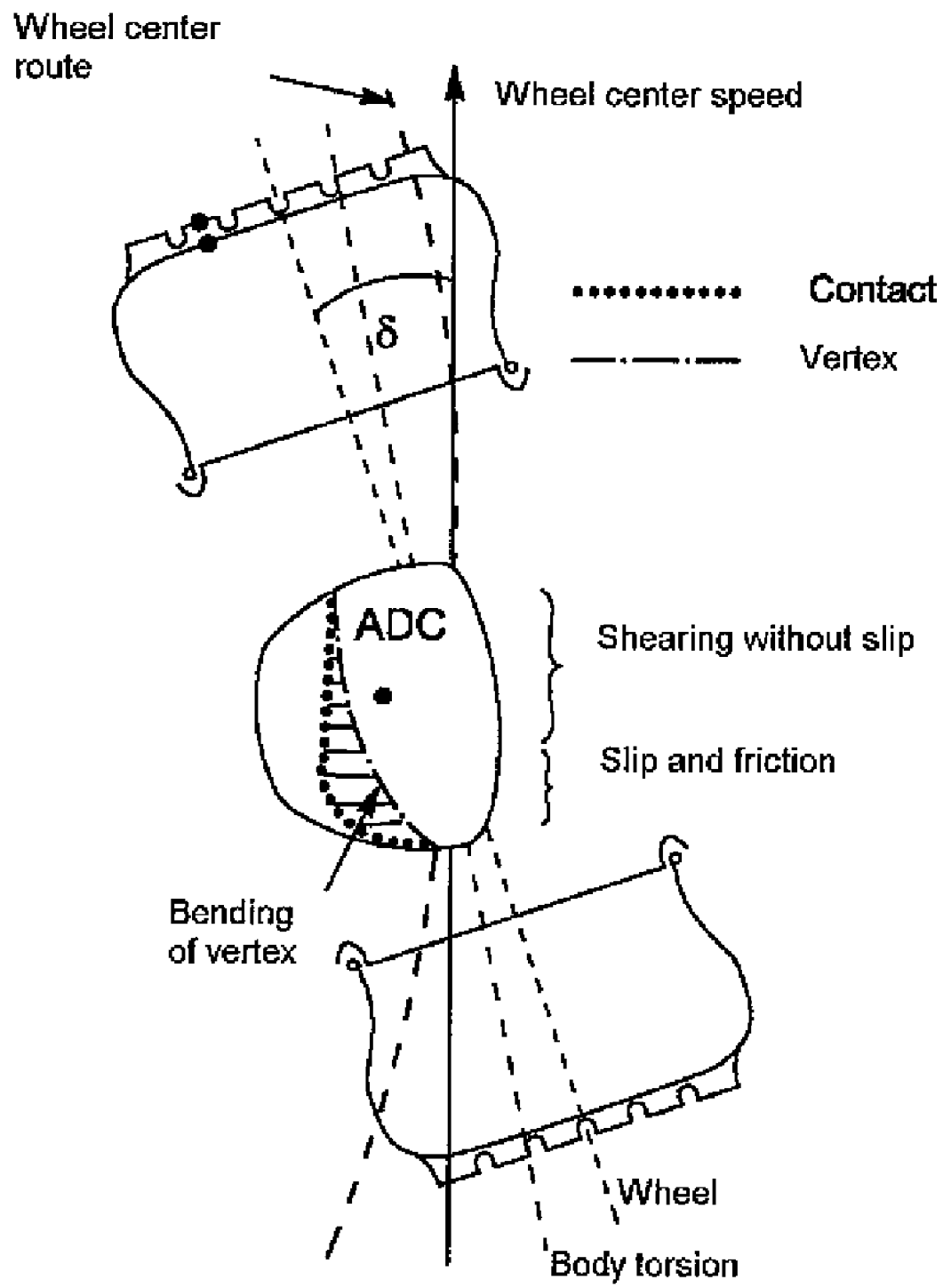
FIG. 12 is a schematic top view of a tire subject to various stresses.

The preferred mechanical tire model is further characterized in that it is defined by considering firstly that the contact area comprises two zones (FIG. 12), i.e. an adherent contact zone where the force is controlled by the shearing of the tread with set displacement and a slippery contact zone where the force is controlled by the friction coefficient between the rubber and the ground, and considering secondly that there is a single abscissa "b" point N marking the transition between the adherent contact zone and the slippery contact zone.

The equations are formulated according to this principle, making it possible to obtain expressions that are quick to resolve.

An example of an advantageous mechanical model is given hereinafter.

In this example, the modeling of the operation of the contact area is based on a "bristle" type approach with a first shearing phase on entering the contact area and a second slipping phase. It is assumed that these two phases are separate, unique and related, and that there is no parasitic shearing resumption mechanism during the slipping phase.

All the developments hereinafter make the assumption that the drift angles remain moderate (less than approximately 20 degrees), so that the approximation $\tan(\delta) \approx \delta$ is valid and will be performed systematically.

Kx and Ky refer to the rigidities of the tire tread, which may be linked with the rubber modulus and the pattern features preferentially according to the following function:

$$\begin{cases} K_X = \dfrac{G * ent}{\dfrac{h_{scre}}{AssX} + h_{sc}} \\ K_Y = \dfrac{G * ent}{\dfrac{h_{scre}}{AssY} + h_{sc}} \end{cases}$$

where $h_{scre}$ is the pattern thickness, and $h_{sc}$ the underlayer thickness, such that $e_{KM} = h_{scre} + h_{sc}$.

Figure 13:
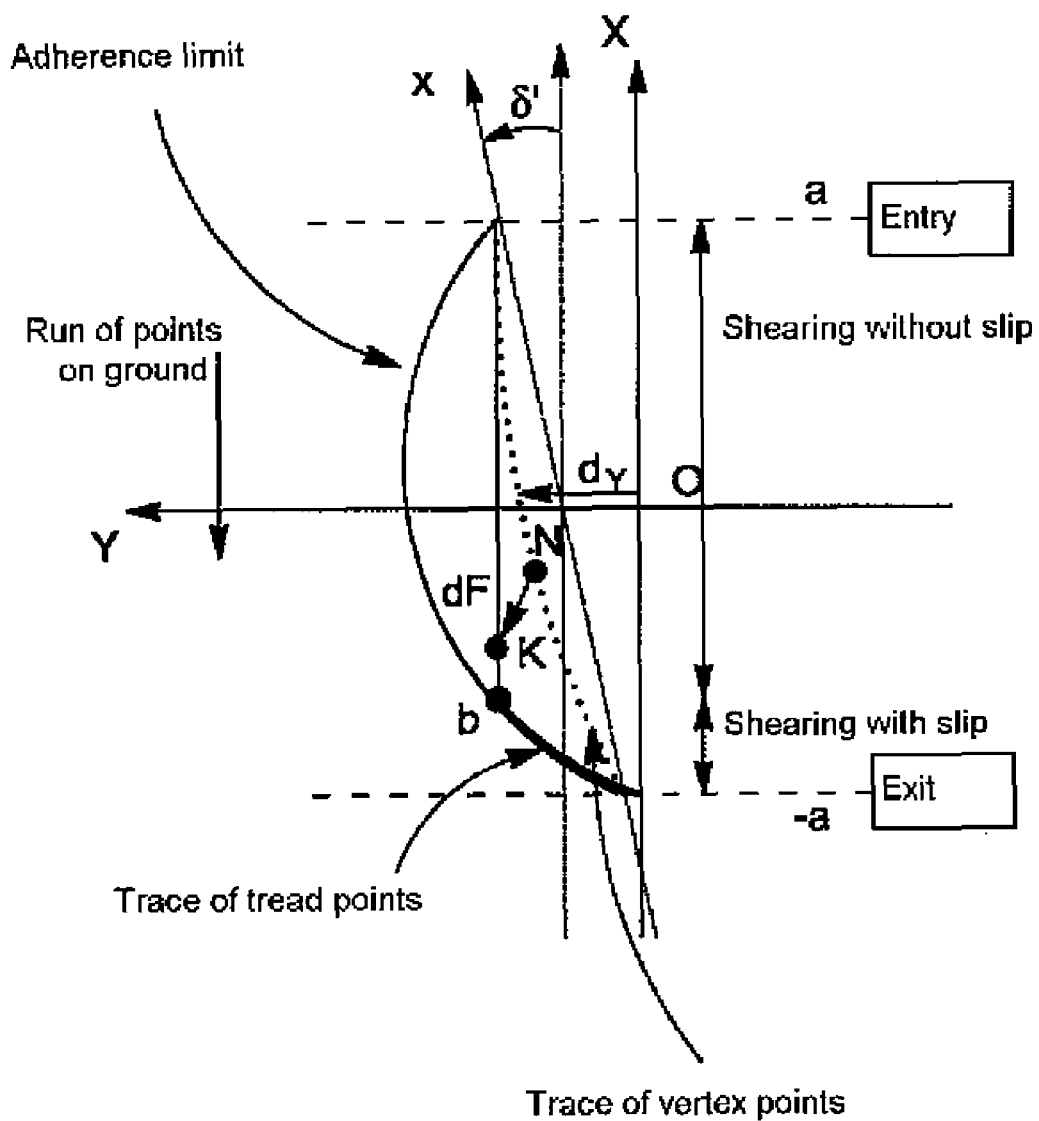
FIG. 13 is an enlarged top view of the contact area of a tire subject to various stresses, and whereon the trace of characteristic points and routes appear.

FIG. 13 is a functional diagram of the contact area. The segment NK defines an element of the tread ("bristle"). N is the point located at the vertex and K is the point of the tread at ground level. The abscissa point b represents the transition between the contact with adherence and the slippery contact.

At the entry to the contact area (see FIG. 13), the rubber element of the tire tread is not sheared ($X_N = X_K$).

In fact, the shearing of the rubber has a plurality of causes: drifting of the wheel by an angle $\delta$, a camber by an angle $\gamma$, and a difference between the speed of the point N of the vertex and the running speed of the points on the ground.

Based on the assumption of a uniform deformation in the thickness of the tread, the basic force generated by the shearing of an element of said tread may be expressed as follows:

$$dF_X = K_X(X_K - X_N)dS$$

$$dF_Y = K_Y(Y_K - Y_N)dS$$

where dS is the basic surface area of the element NK of the tread.

The equation of the route of the vertex points is approximated using the following expression:

$$Y_N = \delta' X_N - \frac{1}{2} S_2 F_Y X_N^2 + \frac{F_Y}{R_L},$$

wherein $\delta'$ is the drift angle of the vertex, which differs from the drift angle due to the torsion of the tire structure, and complies with the following equation:

$$\delta' = \delta + \alpha 1 + \frac{M_Z}{k_T}.$$

Assuming that the expression $Y_K(a)=Y_N(a)$ is satisfied at the entry to the contact area, this gives (equation 1):

$$Y_K - Y_N = \delta'(a - X_N) - \frac{1}{2}S_2 F_Y(a^2 - X_N^2)$$

Where:

V is the speed of the points on the ground, $W_x$ the speed of the points of the vertex along the axis thereof, and $$\tau = \frac{W_X - V}{V},$$

the expression $X_K - X_N$ becomes (equation 2):

$$X_K - X_N = (a - X_N)\frac{\tau}{1+\tau}$$

By definition, $\tau$ corresponds to the longitudinal slip ratio. The components of the slip speed are given by:

$$\begin{cases} Vg_X = \frac{d(X_K - X_N)}{dt} = W_X - V \\ Vg_Y = \frac{d(Y_K - Y_N)}{dt} = (\delta' - S_2 F_Y X_N)W_X \end{cases}$$

In the slippery portion of the contact area, the basic forces are generated by the friction between the rubber and the ground and the direction of the forces is collinear with the shearing vector, which is conveyed by:

$$\frac{dF_X}{dF_Y} = r_K \frac{(X_K - X_N)}{(Y_K - Y_N)} \text{ where } r_K = \frac{K_X}{K_Y}.$$

By noting $$\beta = \delta' - \frac{1}{2}S_2 F_Y(a + X_N),$$

this gives:

$$\frac{dF_X}{dF_Y} = r_K \frac{\tau}{(1+\tau)\beta}.$$

The basic forces in the friction zone are expressed as follows:

$$dF_X = \frac{r_K \tau}{\sqrt{(r_K \tau)^2 + (1+\tau)^2 \beta^2}} \mu(p, Vg, T) p dS$$

$$dF_Y = \frac{(1+\tau)\beta}{\sqrt{(r_K \tau)^2 + (1+\tau)^2 \beta^2}} \mu(p, Vg, T) p dS$$

The abscissa b of the point N wherefrom the slip of the tire on the ground is assumed to occur corresponds to the equilibrium between the basic shearing and adherence forces, this equilibrium being represented by equation 3:

$$[K_X(X_K - X_N)]^2 + [K_Y(Y_K - Y_N)]^2 = [\mu_0 p]^2$$

where $\mu 0$ is the static adherence coefficient at the abscissa point b.

Although, in principle, there may be a plurality of transition points between an adherence zone and a slippery zone in the contact area, the mechanical tire model used in the preferred embodiment of the invention advantageously makes the assumption that this transition point is unique. In other words, once slip occurs in the contact area, this slip is assumed to last until the exit from said contact area.

The equations representing the balance of the forces subject to this unique transition point assumption are given hereinafter.

However, it is possible to give a more general version, corresponding to the scenario where a plurality of transition points exist in the contact area.

Furthermore, the embodiment illustrated in FIGS. 18a and 18b, which renders the tread discrete in the contact area and will be discussed hereinafter, does not make any assumption in principle on the number of transition points in the contact area.

The forces applied at the center of the wheel fitted with the tire in question are obtained by integrating the basic forces developing on the surface of the contact area:

$$F_X = \int_{-Ly/2}^{Ly/2} \int_b^a K_X(X_K - X_N) dS +$$

$$\int_{-Ly/2}^{Ly/2} \int_{-a}^{b} \frac{r_K \tau}{\sqrt{(r_K \tau)^2 + (1+\tau)^2 \beta^2}} \mu(p, Vg, T) p dS$$

$$F_Y = \int_{-Ly/2}^{Ly/2} \int_b^a K_Y(Y_K - Y_N) dS +$$

-continued $$\int_{-Ly/2}^{Ly/2} \int_{-a}^{b} \frac{(1+\tau)\beta}{\sqrt{(r_K\tau)^2 + (1+\tau)^2\beta^2}} \mu(p, Vg, T) pdS$$

The integration results in equations 4 and 5 hereinafter, respectively:

$$F_X = K_X Ly \left[ \frac{1}{2} \frac{\tau}{1+\tau} (a-b)^2 \right] +$$

$$Ly \, ent \int_{-a}^{b} \frac{r_K\tau}{\sqrt{(r_K\tau)^2 + (1+\tau)^2\beta^2}} \mu(p, Vg, T) pdx$$

$$F_Y = K_Y Ly \left[ \frac{1}{2} \delta'(a-b)^2 - \frac{S_2 F_Y}{6}(2a^3 - 3a^2b + b^3) \right] +$$

$$Ly \, ent \int_{-a}^{b} \frac{(1+\tau)\beta}{\sqrt{(r_K\tau)^2 + (1+\tau)^2\beta^2}} \mu(p, Vg, T) pdx$$

The self-alignment torque $M_Z$ has two contributing factors, i.e. a moment $N_Y$ associated with the force $F_Y$ wherein the thrust center is offset with respect to the center of the contact area, and a torque $N_X$ associated with the distribution of the forces FX in the width of the contact area. In general, the torque $N_X$ is a return torque, except in specific cases of high engine torque.

Within the same assumption context as above, the moment $N_Y$ may be calculated directly using equation 6:

$$N_Y = K_Y Ly \left[ \frac{1}{6} \delta'(a^3 - 3ab^2 + 2b^3) - \frac{S_2 F_Y}{8}(a^2 - b^2)^2 \right] +$$

$$Ly \, ent \int_{-a}^{b} \frac{(1+\tau)\beta}{\sqrt{(r_K\tau)^2 + (1+\tau)^2\beta^2}} \mu(p, Vg, T) pxdx$$

The torque $N_X$ is generated by a non-uniform distribution of the forces $F_X$ in the width of the contact area, which tends to be amplified when the contact area is placed in a trapezium under the effect of the offset or camber. In a modeling approach with a single tire rib, the distribution of the forces $F_X$ in the width of the contact area is not directly accessible. In this way, the torque Nx is modeled by an ad hoc function, a mathematical formulation whereof is given hereinafter as an indication as a function of the moment $N_Y$ and the camber (equation 7):

$$Nx = \beta_1(Fz)Ny + \beta_2(Fz,\delta)\gamma$$

An example of local and overall thermal models is given hereinafter.

The local thermal model essentially takes into account the thermal phenomena associated with the contact of the tire tread with the ground in the contact area and the relative slip of the tread in a portion of the contact area.

The overall thermal model takes into account all the heating phenomena and heat exchanges of the tire on at least one revolution.

The formulation of the overall tire forces is based on a breakdown into the tread shearing force and friction force. The friction force is a function of the adherence coefficient μ between the rubber and the ground, said coefficient being dependent on the pressure, slipping speed and contact temperature.

The contact temperature in the contact area is modeled as follows (local thermal model).

During the passage of the rubber in the contact area, the contact temperature varies as a function of the heat conduction and the friction between the rubber and the ground. The temperature in the contact may be calculated in different ways known to those skilled in the art, for example using finite different discrete rendering methods.

The method described hereinafter optimizes the calculation time while resulting in a largely sufficient precision.

On the basis of the assumption of semi-infinite materials with a homogeneous temperature (Ts for the rubber and Tsol for the ground), the surface temperature, when both bodies are suddenly placed in perfect contact, is expressed as follows:

$$T_0 = \frac{T_S e_g + T_{sol} e_{sol}}{e_g + e_{sol}},$$

where $e_g$ and $e_{sol}$ are the effusivity of the rubber and the ground, respectively.

In the case of slip between the rubber and the ground, the friction flow $\phi_F$ generates a rise in the surface temperature, which, when the flow is constant, is expressed as follows:

$$Tc(t) = T_0 + 2\frac{\alpha}{e_g}\varphi_F\sqrt{\frac{t}{\pi}},$$

where α is the sharing coefficient which determines the proportion of flow penetrating the rubber. In the case of perfect contact, this coefficient is expressed by:

$$\alpha = \frac{e_g}{e_g + e_{sol}}.$$

Figure 14:
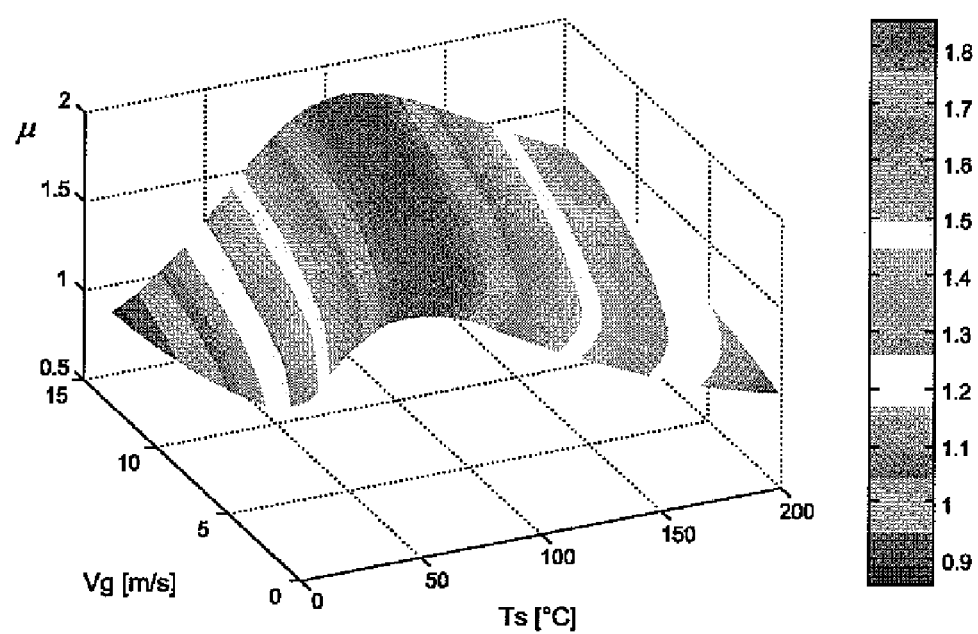
FIG. 14 represents, three-dimensionally, the law linking the adherence coefficient with the contact temperature, and with the slip speed of a tire, for a given contact pressure.

For the rubber-ground adherence law, for which FIG. 14 illustrates the dependence with respect to the parameters Vg, and Tc, a plurality of mathematical formulations obvious for those skilled in the art make it possible to reproduce the variation with temperature, speed and pressure on the basis of specific experiments.

For example, it is possible to use the formula:

$$\mu(T_c, Vg, P_c) = (e_1 \cdot P_c^{\ell2} + e_3)\left[\mu_1 + (\mu_2 - \mu_1)\exp\left(-a^2\log^2\left(\frac{Tc}{T_1}\right)\right)\right]$$

where $T_1 = T_0 + a_2 \log_{10}(Vg/V_0)/[a_1 - \log_{10}(Vg/V_0)]$, where $\mu_1$, $\mu_2$, $T_0$, a, $a_1$, $a_2$, $e_1$, $e_2$, $e_3$, $V_0$ are constants of the model As demonstrated in FIG. 14, the adherence coefficient $\mu$ has a complex variation with the temperature and the slip speed: at low temperatures, this coefficient increases with the temperature; at high temperatures, the opposite is true. Therefore, the coefficient $\mu$ passes through a maximum with the temperature. This maximum is different according to slip speed value. The higher the slip speed, the more the maximum of said coefficient is obtained at high temperature.

The overall thermal model calculates the temperature profile in the thickness of the rubber on average per revolution and in the width of the tread. This model makes it possible to obtain the temperature Ti inside the tread, which determines the rigidity G*(Ti), and the surface (or peripheral) temperature Ts of the tread on entering the contact area, which is used for the thermal calculation in the contact area (local model).

Figure 15:
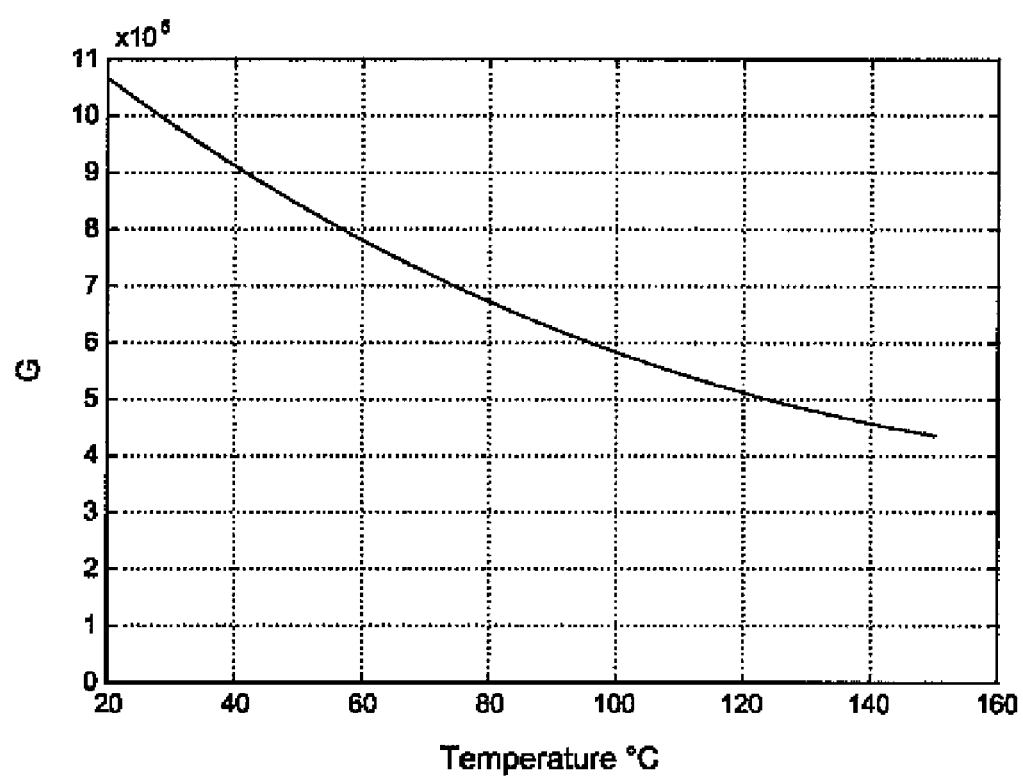
FIG. 15 represents the law linking the shear modulus of the rubber mixture of the tire tread with a temperature, for a given level of stress in terms of frequency and deformation.

An example of a law linking the rigidity with the temperature is illustrated in FIG. 15. In fact, this law is specific for each material used and is dependent on the formulation of the mixtures forming the tire rubber. As a general rule, when the temperature of the mixture increases, the rigidity thereof decreases.

The overall thermal model accounts for the following mechanisms:

conduction in the rubber;
heating by the friction between the rubber and the ground;
heating associated with losses in the rubber; and
cooling by conduction with the ground and convection with air.

Figure 16:
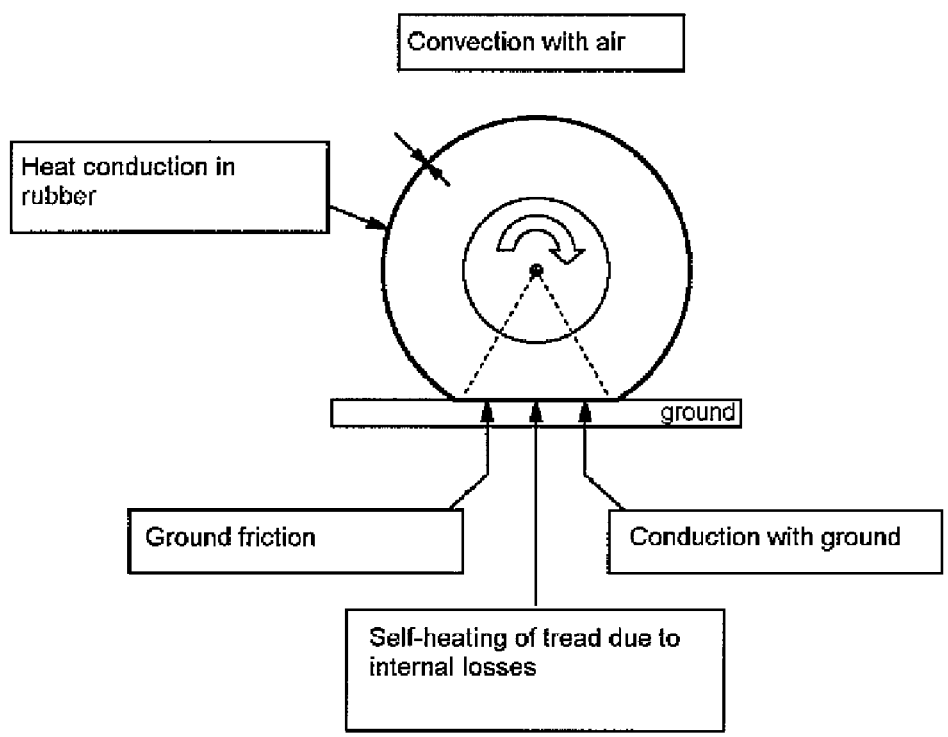
FIG. 16 is a diagram summarizing the thermal phenomena taken into account in the overall thermal model of the tire.

FIG. 16 is a schematic summary of all these mechanisms.

On the basis of the assumption of temperature homogeneity in the width of the tread and on one revolution, it is possible to obtain the one-dimensional equation of the heat in the polar coordinate system associated with the wheel:

$$\frac{\partial T}{\partial t} = \frac{\lambda}{\rho c_p}\frac{\partial^2 T}{\partial x^2} + \frac{\dot{q}}{\rho c_p},$$

where

T represents the temperature profile in the thickness of the tread [° K];
$\lambda$ is the thermal conductivity of the rubber [W/m/° K];
$\rho$ is the density [kg/m³];
$c_p$ is the specific heat of the rubber [J/kg/° K];
$\dot{q}$ is the heat production term due to losses in the rubber in [W/m³];
x represents the radial direction (i.e. in the thickness of the tread);

Effusivity: $e = \sqrt{\lambda\rho c_p}$

Diffusivity:

$$a = \frac{\lambda}{\rho c_p} = \frac{\lambda^2}{e^2} \ [m^2/s]$$

The limit conditions are, however, different depending on whether the outer surface of the tire is taken into consideration or the interface between the tread and the tire breaker strips.

In the former case, the limit conditions of the tire surface are changed on one revolution: outside the contact area, there is a surface flow due to the convection with the surrounding air; in the contact area, there is a surface flow associated with the conduction with the ground and the friction between the rubber and the ground. At the rubber/(ground+air) interface, the limit flow condition applied to the tire surface may be expressed formally as follows:

$$-\lambda\frac{\partial T}{\partial x} = \varphi \ [W/m^2]$$

where $\phi$ is a surface flow yet to be clarified.

The heat radiation exchanges may be ignored.

On the other hand, at the interface between the tread and the tire breaker strips, the assumption of a zero flow may be made (adiabatic condition).

The heat production term $\dot{q}$ [W/m3] due to losses in the rubber may be calculated as follows.

When the rubber enters the contact area, it is subject to compression and shearing deformations which are a source of heat. The dissipated internal power in the rubber on one revolution is calculated as the product, by the loss function P, of the energy supplied during the passage in the contact area Wf and the revolution frequency:

$$\dot{q} = PW_f f$$

The elastic deformation energy density applied to the rubber in the contact area is clarified as a function of the longitudinal, transversal forces and the tire load, making it possible to obtain the final formulation:

$$\dot{q} = P(W_f, T)\frac{1}{2G^*}\frac{V}{2\pi R_0}\frac{F_X^2 + F_Y^2 + F_Z^2/3}{S_{ADC}^2}$$

where $P(W_f, T)$ is the loss function, which accounts for the operation point of the rubber in terms of temperature and stress amplitude and which may be characterized by specific experimentation.

The temperature T corresponds to the characteristic temperature of the mixture and determines among other things the loss and modulus level. Given that the loss and modulus laws are for example measured at a frequency of 10 Hz, the temperature T is in fact an equivalent temperature in terms of the law WLF, to obtain an estimation of the losses and modulus for different stress frequencies:

$$T = T_i + C_2 \log_{10}(f/10)/[C_1 - \log_{10}(f/10)],$$

where $T_i$ is the internal temperature of the mixture following the overall thermal calculation, and where $f = V/(2\pi R_0)$ is the rotation frequency.

As those skilled in the art will understand easily on reading the present description, the same function is used to link the shear modulus of the rubber with the internal temperature Ti, in order to account for stiffening mechanisms of the mixture when the revolution frequency increases.

For the calculation of the conduction flow with the ground, the tread and the ground may be compared to two semi-infinite walls placed in contact during the time interval $t_{adc}$. On the assumption of perfect contact, the conduction flow is expressed as follows:

$$\varphi_{cond} = -2 \frac{e_g e_{sol}}{e_g + e_{sol}} \frac{1}{\sqrt{t_{adc}\pi}} (Ts - T_{sol})$$

where Ts is the surface temperature of the rubber.

The calculation of the convection flow with air is rendered more difficult in that the heat exchange with air is strongly dependent on the nature of the air flow about the tire. As a general rule, convective exchange modeling is based on semi-empirical formulations. In the specific case of the tire, the following formula may be used:

$$\varphi_{conv} = C_{air} 4.126 (2R_0)^{-0.2} V^{0.805} (Ts - T_{air})$$

where $C_{air}$ is a constant accounting for the effect of forced convection.

The friction flow calculation must account for the fact that the friction consisting of the slip of the rubber on the ground is a source of heat production. Strictly speaking, energy is dissipated in the rubber body on thicknesses less than one millimeter. In the case of dry contact, the approximation may be made that the energy is dissipated on the outer surface and is modeled by friction flow. The mean friction flow in the slipping zone of the contact area is expressed as follows:

$$\varphi_{frot} = \alpha \frac{V_g F_\mu}{(1 - ppa) LxLyent}$$

where $\alpha$ is a flow sharing coefficient between the rubber and the ground; a value $\alpha=1$ indicates that the entire friction flow is oriented toward the rubber; a value $\alpha=0$ indicates that the entire friction flow is oriented toward the ground;

$F_\mu$ is the component of the force induced by the friction between the rubber and the ground; Vg is the slip speed; and ppa is the proportion of adherent points in the contact area.

The mean thermal flow on the surface of the tread is defined as the mean of the various flows, weighted by the characteristic time during which said flows are effective during a revolution, conveyed by the function:

$$\varphi = \frac{\varphi_{frot}(1 - ppa)t_{adc} + \varphi_{cond}t_{adc} + \varphi_{conv}T_{Hadc}}{t_{adc} + t_{Hadc}}$$

where $t_{adc}$ corresponds to the passage time of a tread element in the contact area; where $t_{Hadc}$ is the passage time of a tread element outside the contact area; and where $(1-ppa)t_{adc}$ is the time during which a tread item slips in the contact area.

Figure 17:
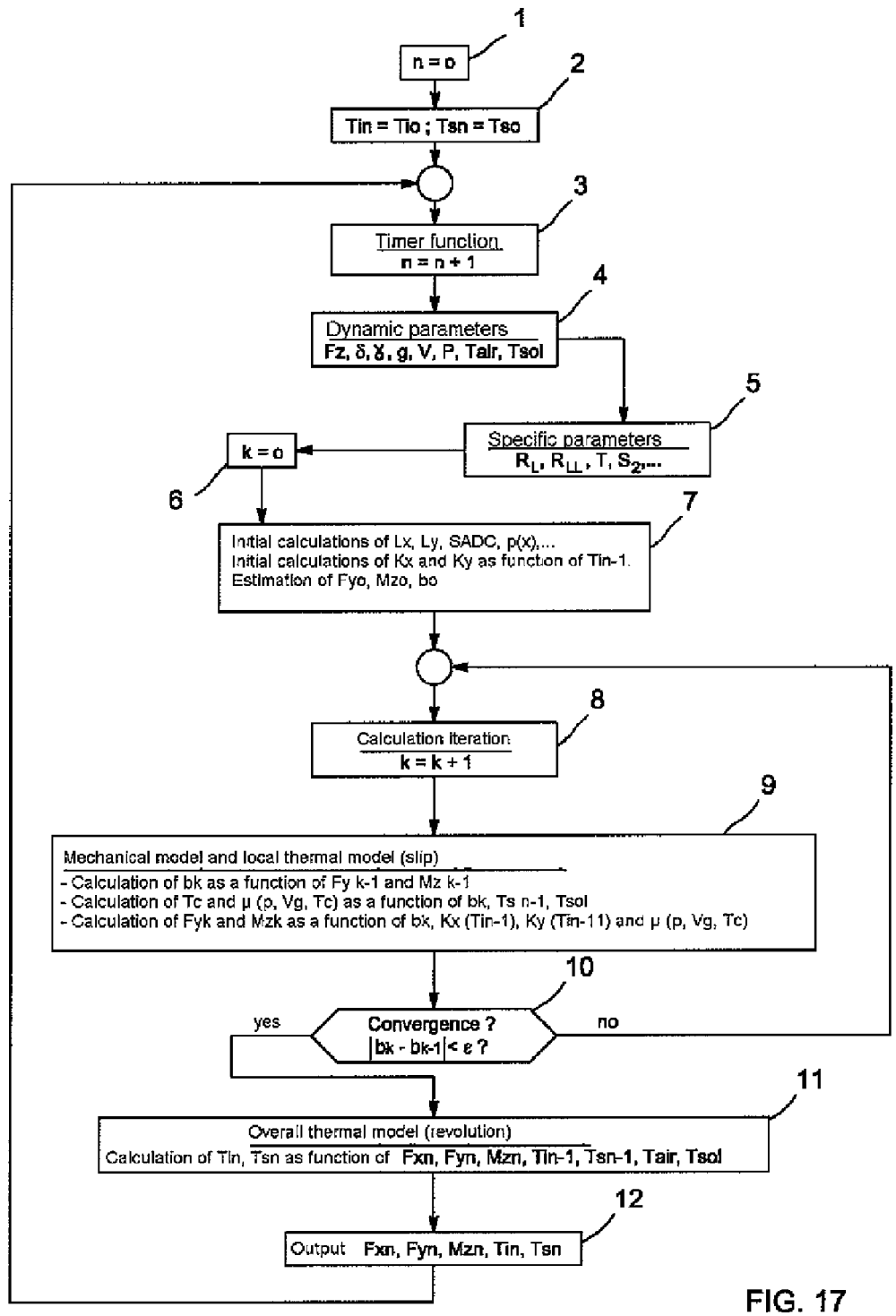
FIG. 17 is a flow chart illustrating the operational structure of the preferred tire model that can be used in the method according to the invention.

FIG. 17 illustrates overall the operational embodiment of a method according to the preferred tire model which can be used in the method according to the invention.

Upstream from the operational embodiment thereof, the embodiment of said tire model comprises a preliminary modeling phase during which the mechanical model or first model, local thermal model or second model, and the overall revolution thermal model, or third model, are defined.

Each model is defined by applying physical laws that are known and/or constructed by means of specific experimentation, and takes the form of a system of equations such as those described above for each model.

As a reminder, the mechanical model provides the expressions of the longitudinal forces and the transversal forces which are transmitted by the tire between the ground and the vehicle, the self-alignment torque which is associated with the intensity of said forces and the distribution thereof in the contact area, and the equilibrium of the basic tire shear and slipping forces at the transition point N, assumed to be unique in the preferred embodiment of the invention, between the adherent and slippery contact zones, said expressions being given as a function of the dynamic parameters which are associated with the physical driving and usage conditions of the tire, the specific physical parameters of the tire, and the abscissa b of the transition point.

The local thermal model provides the expression of the contract temperature variations of the tread with the ground from the entry to the exit of the contact area, said variations particularly being dependent on the peripheral tread temperature, the ground temperature, and the slip of the tread on the ground.

The overall thermal model provides the temperature profile in the thickness of the tread and the variations, over a revolution period, of the peripheral tread temperature and the internal tire temperature, as a function in particular of the values previously known or estimated of the peripheral and internal temperatures, the heat conduction coefficient of the tread, and thermodynamic component phenomena such as internal deformations experienced by the tire, heat exchanges between the tire and the environment thereof, and slipping of the tread on the ground.

Furthermore, the mechanical model accounts for the adherence coefficient and the shear modulus in the form of variables of functions of the peripheral temperature and the internal temperature.

The tire model processing phase, which is based on the results of the modeling phase, comprises digital value allocation operations and resolution operations.

The allocation operations essentially consist of attributing digital values to the dynamic parameters and the specific parameters, whereas the resolution operations essentially consist of deducing, particularly using the mechanical model and the values attributed to the dynamic parameters and the specific physical parameters, the values of the longitudinal forces Fx, transversal forces, and the self-alignment torque Mz.

The peripheral temperature value Ts, obtained by means of resolution operations relating to the overall thermal model, is used by resolution operations relating to the local thermal model to account for the temperature dependency of the adherence coefficient.

Furthermore, the internal temperature value Ti, also obtained by means of resolution operations relating to the overall thermal model, is used by resolution operations relating to the mechanical model to account for the temperature dependency of the shear modulus of the tire rubber.

The mechanical model preferentially includes equations associated with the equilibrium conditions of the basic shearing and slipping forces of the tread in the contact area, and based whereon the mechanical model and the local thermal model of the tire are linked.

In practice, the embodiment of the tire model advantageously comprises an iterative calculation phase consisting of a sequence of calculation cycles, each calculation cycle comprising at least one resolution operation relating to the mechanical model and one resolution operation to the local thermal model.

The processing phase of said tire model, following the modeling phase and illustrated in FIG. 17 for the most advantageous embodiment, firstly comprises an operation 1 consisting of setting a counter index n used to measure the time.

In operation 2, initial values Tso and Tio are attributed to the peripheral temperature of the tread and the internal tire temperature, for example on the basis of the assumption that the tire is initially in thermal equilibrium with the ambient air.

Operation 3 increments the time counted by the timer by a time interval corresponding to at least that required to perform the subsequent calculations as described hereinafter.

Previously measured values stored in memory are then attributed to the dynamic parameters (operation 4) and the specific parameters (operation 5).

Operation 6 consists of setting a counter index k used to count the number of successive calculation cycles performed within an iteration loop described hereinafter.

Operation 7 consists of a preparatory phase particularly for enabling the calculation of contingent quantities wherein the value may be considered as constant for the various calculation cycles of the same iteration loop, which makes it possible to avoid the repeated execution of said calculations in each calculation cycle of the same iteration loop.

In particular, the preparatory phase 7 is used to calculate the dimensions Lx and Ly of the contact area, the surface area $S_{ADC}$ thereof, the pressure profile p(x) along the contact area, similarly the rigidities Kx and Ky of tread as a function of the internal temperature Ti at the prior time n−1, i.e. Tin−1.

Estimated values Fyo, Mzo and bo are further attributed to the lateral forces Fy, the self-alignment torque Mz, and the abscissa b of the transition point N between the adherent contact zone and the slippery contact zone.

When the input parameters vary slightly over time, the estimated values Fyo, Mzo and bo may consist of the values calculated at the previous time.

Otherwise, the slip start abscissa bo is determined assuming that the pressure profile in the length of the contact area is parabolic and ignoring the torsion rigidity and the rigidity of the vertex.

In this case, the slipping equation (equation 3) has an analytical solution:

$$b_0 = a\left(\frac{4}{3}\frac{a^2}{\mu_0 F_Z/Ly}\sqrt{\left[K_X\frac{\tau}{1+\tau}\right]^2 + [K_Y(\delta+\alpha_1)]^2} - 1\right)$$

Given $b_0$, the force $F_{y0}$ and the torque $M_{Z0}$ are then calculated on the basis of equations 5 to 7.

In addition, it is necessary to verify that the initial position obtained for the transition point satisfies the constraint of the lateral shearing sign of the tread, i.e. $(Y_K-Y_N)\delta'>0$. If this is not the case, the envisaged solution does not make physical sense. It is necessary to apply: $Y_K-Y_N=0$, and the initial value $M_{Z0}$ of the self-alignment torque is set to 0.

Operation 8 increments the counter index k and makes it possible to initiate a first or a new calculation cycle (steps 9 and 10) of the iterative phase.

This iterative phase is used to resolve by means of successive approximations, and on the basis of the previously known or estimated values of the abscissa b of the transition point, the transversal forces Fy, and the self-alignment torque Mz, new values of said quantities b, Fy and Mz which resolve equations 1 to 7 described above, for the values attributed to the dynamic parameters and the specific parameters.

These equations are formulated by demonstrating the abscissa b of the transition point between the adherent contact zone and the slippery contact zone, the forces in the contact area being broken down into two contributing factors, i.e. a shearing force which is dependent on the rigidities of the rubber, the vertex and body of the tire, and a friction force dependent on the friction law.

The abscissa b is calculated on the basis of equations 1 to 3 and the values of Fy and Mz estimated to the previous iteration. It consists of a scalar equation, wherein the solution is limited ($-a \leq b \leq a$). The calculation of the abscissa b is performed for example by combining a bisection and a secant.

If the displacement proposed by the secant method is outside the lower and outer limits, the tire model switches to a bisection interval.

As a plurality of solutions of the abscissa b are possible in principle, the solution adopted is that satisfying the condition $(Y_K-Y_N)\delta'>0$.

The integrals and $$\int_{-a}^{b}\mu(P(x), T, Vg)P(x)dx$$

and $$\int_{-a}^{b}\mu(P(x), T, Vg)P(x)x\,dx$$

associated with the friction on the ground of the tread rubber are for example calculated using Gaussian squaring formulas.

For the calculation of the residue of the system consisting of the equations 4, 5, and 6+7, and the calculation of the convergence, it is necessary to resolve the non-linear system of n equations into n unknown values noted formally: F(x)=0.

Although a plurality of iterative methods are possible, the optimal method appears to consist of the composite Newton-Raphson/Broyden iterative method known to those skilled in the art.

For each order calculation cycle of the rank k, step 9 particularly comprises an operation consisting of calculating a new provisional value bk of the abscissa of the transition point on the basis of equations 1 to 3 equilibrating the basic forces and the previously known or estimated values $F_{Yk-1}$ and $M_{Zk-1}$ of the transversal forces and the self-alignment torque.

In the case of the preferred tire model, wherein the mechanical model is enhanced by the local thermal model and particularly takes into account the influence of the variation of the contact temperature on the value of the friction coefficient of the tire rubber on the ground, step 9 also comprises, for each point of the slippery contact zone, the calculation of the contact temperature Tc and the friction coefficient as a function of the newly calculated provisional value $b_k$ of the abscissa of the transition point, the peripheral temperature $T_{sn-1}$ as known at the previous time, and the ground temperature $T_{sol}$, the peripheral temperature $T_{sn-1}$ of the tire being used to calculate the contact temperature at the entry to the contact surface.

Finally, step 9 comprises the operation consisting of calculating, on the basis of the new provisional value $b_k$ of the abscissa of the transition point, the values of the rigidities Kx and Ky of the tread for the internal temperature Tin−1 as known at the prior time, the value of the friction coefficient μ, and the equations 1 to 7, new values $F_{Yk}$ and $M_{Zk}$ of the transversal forces and the self-alignment torque, usable for any subsequent calculation cycle.

Step 10 consists of testing the convergence of the iterative phase.

For example, if the respective differences between, on one hand, the new values $b_k$, $F_{Yk}$ and $M_{Zk}$ and, on the other, the provisional values $b_k$, $F_{Yk-1}$ and $M_{Zk-1}$ from the previous calculation cycle are less than respective limits such as ε, whereas the iterative phase is interrupted. Otherwise, this iterative phase is continued by looping upstream from operation 8.

When the iterative phase is interrupted, the overall revolution thermal model is used (step 11) to calculate the new updated values $T_{sn}$ and $T_{in}$ of the peripheral and internal temperatures accounting for the variations experienced by said temperatures, from the end of the previous iterative phase, under the effect of all the thermodynamic component phenomena, such as the internal deformations experienced by the tire, the heat exchanges between the tire and the environment thereof (air, ground) and the slip of the tread on the ground.

It is noted that the temperature Ts is the mean surface temperature, both in the width and in the circumference of the tire, of the tread, and that the calculation of the temperatures Ti and Ts is based on a unidirectional modeling in the thickness of the tread.

The overall thermal model equations are resolved by a conventional finite difference method approach using a spatial mesh in the thickness of the rubber and a $2^{nd}$ degree Runge-Kutta resolution method over time.

Operation 12, implemented at the end of the iterative phase, consists of delivering, for the time n, the values of the longitudinal and transversal forces Fxn, Fyn, the self-alignment torque Mzn, the internal temperature Tin of the tire, and the peripheral temperature Tsn of the tread.

The method is then looped immediately upstream from the timer incrementation operation 3, and before the dynamic parameter update operation 4 which is used to account for the variations experienced by said parameters during the execution time of the iterative phase that has just been completed.

The new internal temperature value Tin of the tire will be used for the specific parameter update operation 5, or during the preparatory phase 7, to deduce the new rigidity value G* of the mixture forming the tire rubber, which determines the values of the rigidities Kx and Ky.

Furthermore, the new peripheral temperature value Tsn of the tread will be used in step 9 to calculate the contact temperature Tc at the entry of the tread.

Therefore, it is understood that the link between the force determination process and the temperature determination process is involved at two levels, i.e., on one hand, by accounting for the fact that the mean temperature Ti of the tread influences the rigidity G* of the mixture and therefore the rigidities Kx and Ky of the tread, and, on the other, by accounting for the fact that the peripheral temperature Ts of the tread in the contact area influences the adherence coefficient between the rubber and the soil.

The tire simulation method described above is particularly applicable to the real-time simulation of the dynamic behavior of a vehicle fitted with a chassis and a plurality of tires driving on the ground.

This tire model may then for example be implemented on a laptop computer having the following features: Windows XP PC, Pentium 4 3.6 GHz, 2 GB of memory; the performances of the simulation method of a single tire in a drift driving situation and in the presence of slipping are 9000 full calculations per second, where each calculation corresponds to the determination of the longitudinal and transversal forces, the self-alignment torque and the surface and internal temperatures of the tire at a given time as a function of the dynamic and specific parameters.

In the vehicle applications, each of the mechanical, local thermal and overall thermal models, or at least the first thereof, is processed for each tire and associated with a dynamic chassis model, an example whereof will be given hereinafter.

Each of the tire models cooperates with this chassis model, on one hand, to receive from the chassis model the values of the dynamic parameters or at least some thereof, and, on the other, to enable the chassis model to process, for each tire, the values of the longitudinal forces, transversal forces and self-alignment torque obtained using the tire models.

Figure 18A:
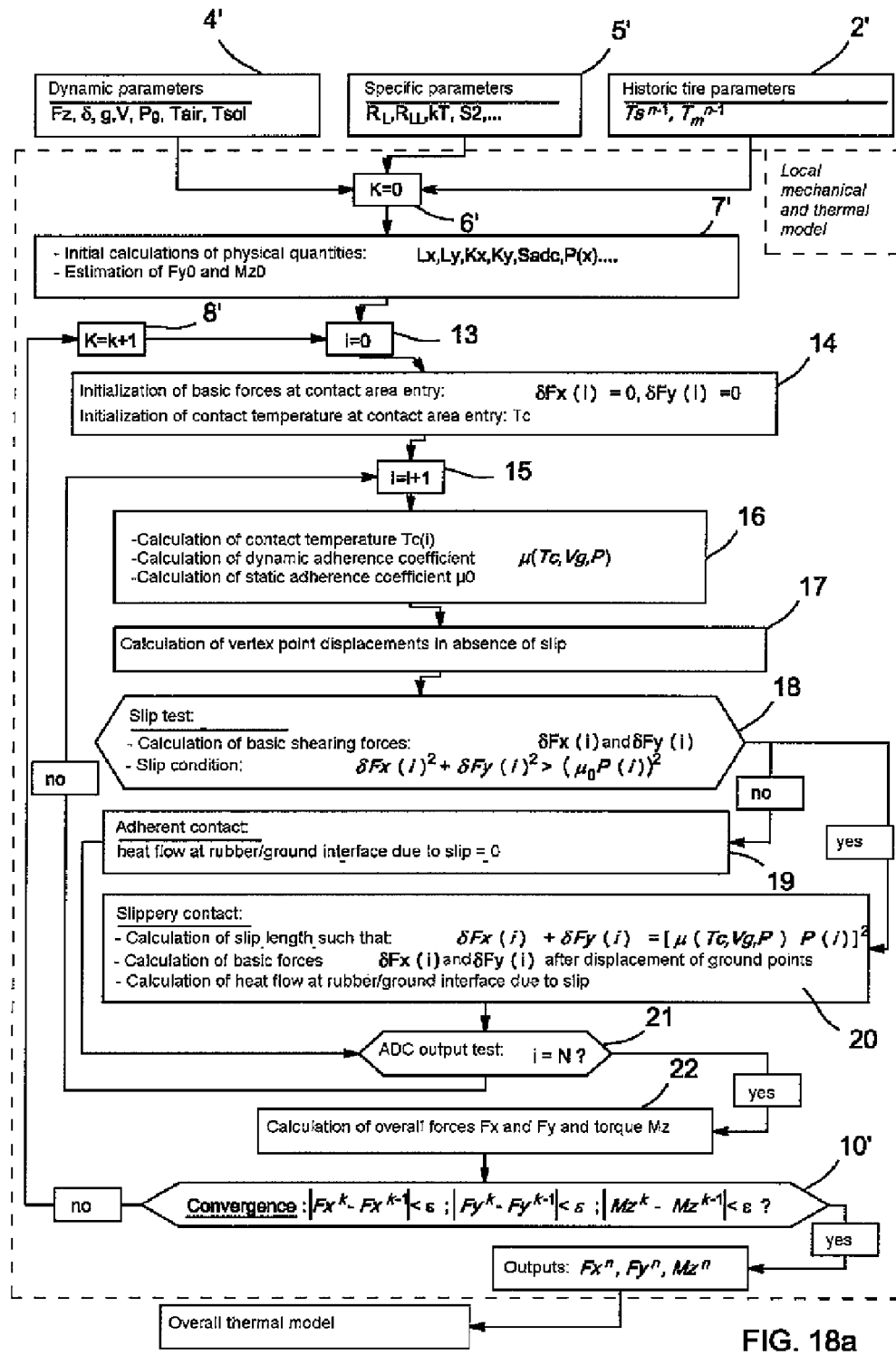
FIGS. 18a and 18b are flow charts illustrating the operational structure of another preferred tire model that can be used in the method according to the invention.
Figure 18B:
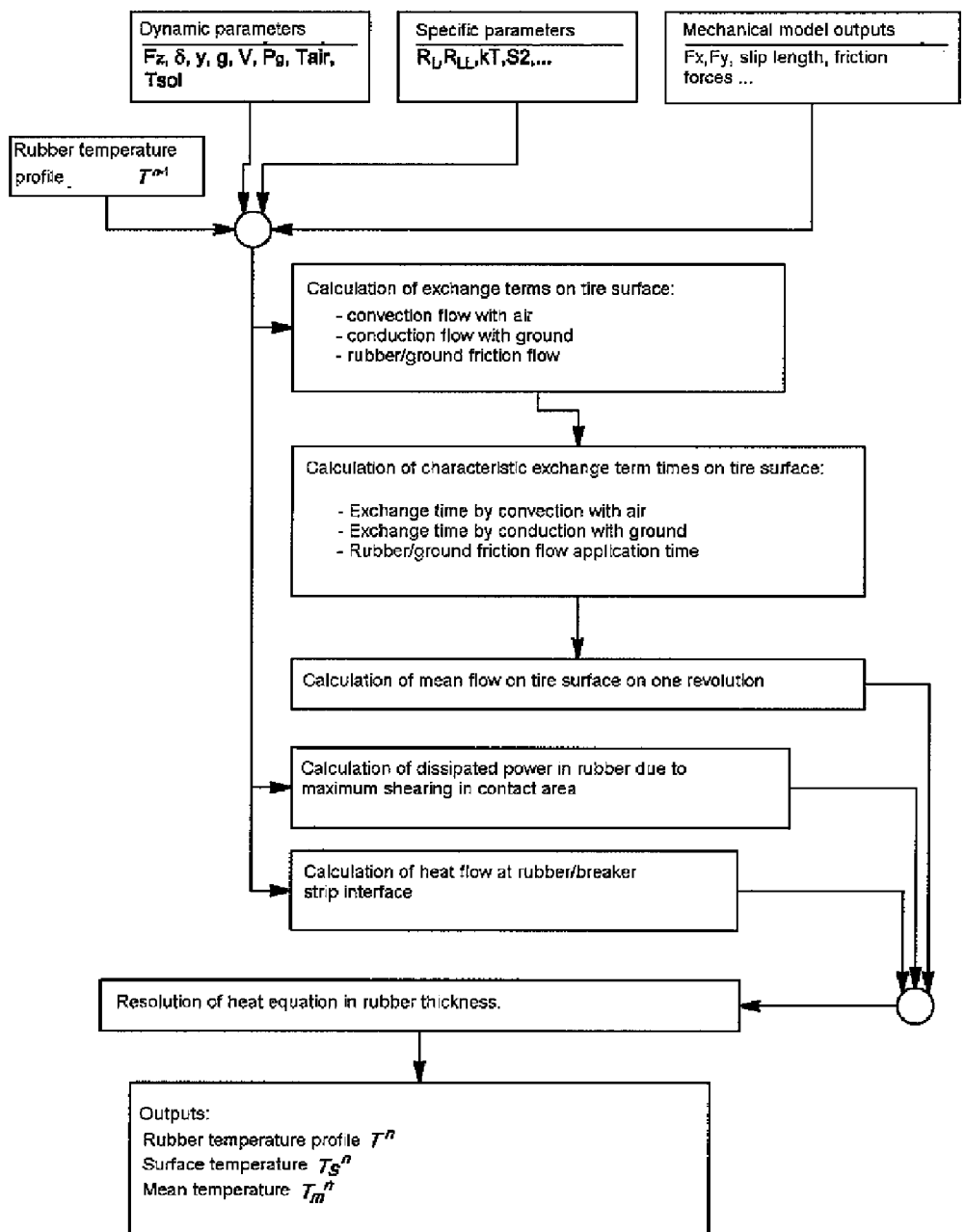

FIGS. 18a and 18b illustrate, for a defined time interval n, the processing phase of another tire simulation model which, although it is considerably less economical than the previous one in terms of calculations, also offers a high level of realism thereto.

In said other tire model, the contact area is rendered discrete for example on N successive zones of the length thereof and the equilibrium of the basic shearing and slipping forces of the tread in the contact area (ADC) is examined on each surface element.

More specifically, each cycle of each iterative phase comprises N successive analysis operations of the equilibrium conditions of the basic shearing and slipping forces on the N different respective surfaces of the contact area, and each cycle of the iterative phase is interrupted when all the basic surfaces in question during this cycle overlap with the contact area.

Operations 2', and 4' to 8' of this model are the same as operations 2 and 4 to 8 of the model in FIG. 17, respectively.

Operation 13 consists of setting a counter index i used to count the analysis operation of the basic force equilibrium conditions on the various basic surfaces.

Operation 14 consists of a preparatory phase to set the values of the basic transversal and longitudinal forces δFx(i) and δFy(i) to zero upstream from the first basic surface of the contact area, and set the initial value of the contact temperature Tc.

Operation 15 increments the counter index i and makes it possible to approach the basic forces in a first or a new basic surface of the contact area, operations 16 and 17 being devoted to the calculation of said forces.

Test 18 is intended to determine whether the basic shearing forces of the tread are greater than the adherence or not.

If not, operation 19 sets the heating which would have been associated with the slip of the tread on the ground to zero.

On the other hand, in the event of slip, operation 20 determines the slip conditions precisely and calculates the heat flow associated with said slipping according to the local thermal model.

Whether slip occurs or not, test 21 is performed to determine whether the basic surface in question is or is not the last of the N basic surfaces of the tread in the contact area rendered discrete.

If not, the next surface is analyzed after returning to operation 15.

Otherwise, operation 22 is performed to calculate the longitudinal and transversal forces and the self-alignment torque by summing the basic forces and the basic torques obtained for the different basic surfaces.

Test 10', which is equivalent to test 10 in FIG. 17, either results in returning to operation 8' to continue the iterative phase, or providing the values of the forces and the self-alignment torque for the calculation cycle in question and implementing the allocation and resolution operations for the overall thermal model, as listed in a directly legible manner in FIG. 18b.

Vehicle Modeling and Simulation

This section describes a possible embodiment of step (c) and each step of the method according to the invention involving the simulation of the physical behavior of the vehicle using a chassis model completed with a tire model, the latter consisting for example of the model described in the previous section.

This section of the description will use the further writing conventions hereinafter.

Tr Aerodynamic drag
g % Slip Ratio
$\alpha_V$ Steering wheel angle
P Tire inflation pressure (four-component vector)
$\psi$ Yaw angle (rotation about vertical vehicle axis)
$\Psi$ Rate of yaw (rotation about vertical vehicle axis)
t Time
x Vehicle position (two-component vector)
v Vehicle speed (as above)
a Vehicle acceleration (as above)
R Radius of curvature of route
m Vehicle mass [Kg]
$h_{CDG}$ Height of center of gravity [m]
$h_{CDR}$ Height of rolling center [m]
E Vehicle wheel base [m], where $E=e_1+e_2$
e1 Distance between center of gravity and front axle [m]
e2 Distance between center of gravity and rear axle [m]
Gauge Gauge [m]. In principle, the gauge is not the same at the rear and at the front. A distinction should be made between:
  $Gauge_{FR}$: $l_1$ [m]
  $Gauge_R$: $l_2$ [m]

Furthermore, when it is necessary to refer to a quantity for each wheel, the following notations will be used:
  index 1 refers to the front left wheel (for example $F_{x1}$);
  index 2 refers to the front right wheel (for example $F_{x2}$);
  index 3 refers to the rear left wheel (for example $F_{x3}$);
  index 4 refers to the rear right wheel (for example $F_{x4}$).

In fact, the simulation of a vehicle according to present description implicitly includes a driver model in addition to a vehicle chassis model and a tire model.

However, the driver is assumed to follow a required route, so that the controls applied by the driver model to the vehicle are limited to the stresses applied to the tires, i.e. slip and drift.

A racing vehicle such as a Formula 1 vehicle is simulated by a four-wheeled chassis and tire model, whereas a motorcycle is simulated by a two-wheeled model.

However, the four-wheeled model is typically obtained by extension of the two-wheeled model, whereto the functions describing the lateral load transfer in bends (therefore, there is one load per wheel and not per axle) and functions describing the camber for each wheel (inclination) are added.

Most of the vehicle model data may be obtained directly or indirectly on the basis of measurements made on actual vehicles.

Figure 19:
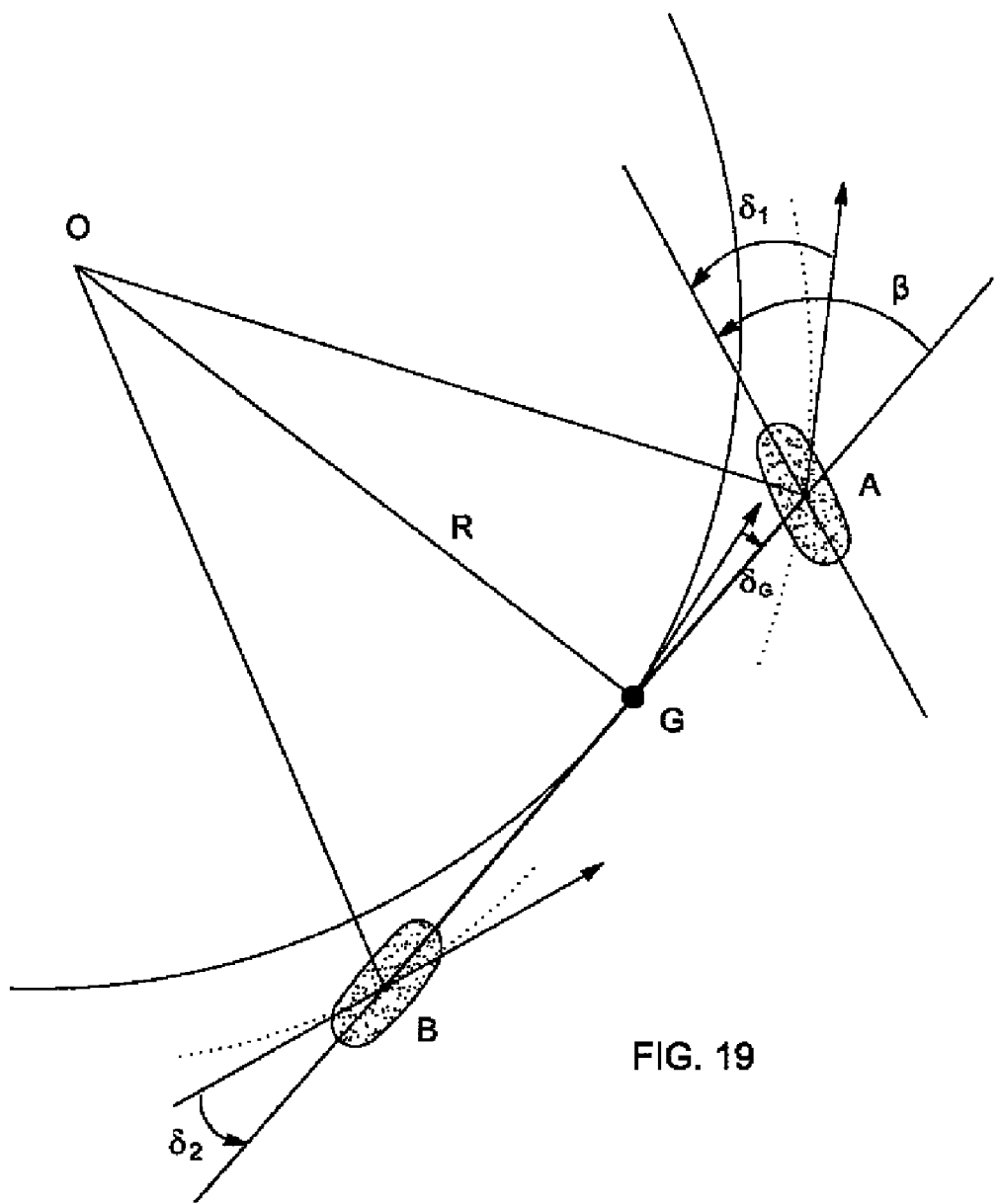
FIG. 19 is a diagram illustrating the operation of a two-wheeled vehicle in continuous operation.

The steady state operation of a two-wheeled vehicle, well known to those skilled in the art, is briefly summarized hereinafter with reference to FIG. 19.

At a time t, the two-wheeled vehicle follows a circular route having a radius of curvature R, with a speed V.

A centrifugal acceleration is applied on the center of gravity of the vehicle. To take the bend, the vehicle will need to compensate for this acceleration with forces generated by the front and rear axles. These forces will be produced by the drift of the front and rear tires.

The speed vectors of the center of gravity G and the centers of the wheels are represented by the arrows tangent to the circular route having the center O and radius R.

The distance between the center of gravity G and the front axle (A) is referenced $l_1$; the distance between the center of gravity G and the rear axle (B) is referenced $l_2$; the front drift is referenced $\delta_1$; the rear drift is referenced $\delta_2$; the body drift, the angle between the speed vector in G and the orientation of the vehicle is referenced $\delta_G$; the turning angle of the front axle is referenced $\beta$.

Under these condition, the body drift angle is calculated with:

$$\delta_G = \delta_2 - \frac{l_2}{R}.$$

And the turning angle of the front axle is given by:

$$\beta = \frac{l_1 + l_2}{R} + \delta_1 - \delta_2.$$

In the four-wheeled model, the camber for each wheel may be modeled (in a purely heuristic fashion) by means of an affine function of the transversal acceleration $\alpha_T$ according to the formula:

$$\gamma = k_{\gamma 1}\alpha_T + k_{\gamma 2},$$

wherein the parameters $k_{\gamma 1}$ and $k_{\gamma 2}$ may be obtained on the basis of measurements on actual vehicles, the transversal acceleration sign being dependent on the right or left location of the concavity of the bend.

In that the aerodynamic load (in this case referenced Fz by deviation from the selected notations) applied on the vehicle varies with the speed, it is taken into account in the form of a $4^{th}$ degree polynomial dependent on said speed, such that:

$$Fz = kz_0 + kz_1 v + kz_2 v^2 + kz_3 v^3 + kz_4 v^4,$$

said polynomial being defined by approximating experimental readings.

The total load is then distributed on the front and rear axles according to the aerodynamic balance B:

$$\begin{cases} Fz = Fz_{FR} + Fz_R \\ \dfrac{Fz_{FR}}{Fz} = B \end{cases}$$

the aerodynamic balance being assumed to be an affine function of the speed, and therefore having the form:

$$B = k_{B0} + k_{B1} v$$

It is customary to look at the values of the aerodynamic balance at 150 km/hr and 250 km/hr.

If $Fz_i$ are loads per wheel measured on the different wheels of the vehicle, and if m is the mass (optionally corrected for the fuel consumption), the total aerodynamic load is given by:

$$\sum_{i=1}^{4} Fz_i - 9.81 \, m$$

It is also necessary to account for the drag, which a longitudinal aerodynamic force blocking the forward motion of the vehicle, particularly important at high speeds. This force is in fact subtracted from the sum of the forces $Fx_i$ in the longitudinal equilibrium equation of the vehicle.

The drag is for example modeled by a $2^{nd}$ degree polynomial such as:

$$Tr = k_{Tr0} + k_{Tr1} v + k_{Tr2} v^2.$$

The vehicle engine may, in turn, be simply modeled by a maximum available power: approximately 850 hp with a V10 engine, and 650 hp with a V8 engine and for example a single engine speed.

Therefore, the power output by the rear axle is limited by the maximum power expressed in horsepower, i.e.:

$$(F_{x3} + F_{x4}) v \leq 746 p_{max}.$$

In a steady state, the vehicle will be governed by the equations of the dynamics associating the accelerations with the forces and moments, these equations relating to:

The longitudinal equilibrium equation:

$$m a_L = \Sigma Fx + Tr,$$

the transversal equilibrium equation:

$$m a_T = \Sigma Fy,$$

and the yaw equilibrium equation, which may be approximated using the formula:

$$\ddot{\psi} = \frac{d}{dt}\left(\frac{v}{R}\right) = \frac{1}{R^2}\left(\frac{dv}{dt} R - v \frac{dR}{dt}\right) = \frac{a_L}{R}.$$

The vertical load for each wheel is the sum of four contributing factors, i.e.:
- a static load corresponding to the mass of the vehicle distributed per axle and per wheel;
- an aerodynamic load calculated as described above;
- a longitudinal load transfer; and
- a transversal load transfer.

The load per axle may be calculated using the mass distribution (for example: $r_{FR} = 48\%$ for the front and $r_R = 52\%$ for the rear). This could give:

$$Fz_{FR} = 9.81 \, m \, r_{Mass \, FR},$$

$$Fz_R = 9.81 \, m \, r_{Mass \, R},$$

the load per wheel being half of the load per axle.

The aerodynamic load may be calculated as described above. The aerodynamic load per wheel is estimated at half the load on the axle.

The longitudinal load transfer proportional to the longitudinal acceleration of the vehicle is given by:

$$\Delta Fz_L = m a_L \frac{h_{CDG}}{E}.$$

This load is subtracted from the front axle and added to the rear axle: in braking, $a_L < 0$, such that part of the load is transferred to the front axle.

As above, this contributing factor must be divided by two to obtain the value per wheel.

The transversal load transfer proportional to the transversal acceleration of the vehicle is given by:

$$\Delta Fz_T = -m a_T \frac{h_{CDR}}{\text{Gauge}} r_{Rolling}$$

The gauge being different at the front and the rear, the transversal load transfers will naturally not be the same. Furthermore, the rolling distribution is not the same between the front axle and the rear axle.

The rolling distribution is calculated using the rolling balance which is dependent on the speed, and therefore:

$$\begin{cases} r_{Rolling_{FR}} = k_{Rolling1} v + k_{Rolling2} \\ r_{Rolling_R} = 1 - r_{Rolling_{FR}}. \end{cases}$$

The rolling distribution law coefficient may be obtained using measurements on actual vehicles.

The lateral load transfers must be added on the left wheels and subtracted on the right wheels, without dividing by two, unlike the previous scenarios.

Other equations may also be added to the vehicle model in the form of constraints to be observed to improve the realism of the simulation.

The simulation of the vehicle taken overall, i.e. consisting of the chassis and the tires, is performed, in a manner known per se, by injecting into the input parameters of the chassis model the mechanical stresses transmitted by the tires to the chassis, as they are known by the calculations made on the basis of the tire model applied to all the tires, and by injecting into the input parameters of the tire model applied to each tire the mechanical stresses transmitted by the chassis to each tire, as they are known by the calculations made on the basis of the chassis model.

The invention claimed is:

1. A method for selecting, from a set of possible configurations, an optimized tire configuration for fitting a vehicle intended to run on a circuit following a predefined route, oriented in a single course direction and including bends, said method comprising the steps of:
   developing a physical model of the vehicle fitted with a first tire configuration;
   dividing a digital image of the predefined route into successive segments by connecting at points with associated vehicle speed limit values;
   simulating, in iterations, the course by the modeled vehicle, of each route segment, firstly at maximum acceleration on portions of a route taken successively in an actual course direction and belonging to a first segment portion including an initial point of said route segment, and at maximum deceleration on route portions taken successively upstream from each other and belonging to a second segment portion including an end point of said route segment, and connecting the first and second segment portions at a point of the route segment where a speed of the modeled vehicle on the first portion of said route segment does not exceed the speed of the modeled vehicle on the second portion of said route segment;

storing in memory a course time taken by the vehicle to cover the predefined route at least once;

comparing the course time to at least one reference time and producing a comparison result; and optionally selecting a first optimized configuration as a function of the comparison result.

2. The method according to claim 1, wherein the vehicle model includes a thermomechanical model of tires fitted in the vehicle.

3. The method according to claim 1, further comprising the steps of:
(a) inventorying a set of physical parameters tending to limit the speed adopted by the vehicle on the predefined route, said set of physical parameters comprising constant parameters and dynamic parameters, said set of physical parameters being linked with at least one of different possible tires, vehicle chassis and driving conditions, and including the digital image of the predefined route, consisting of digitized coordinates of successive points of said predefined route;
(b) developing a tire model describing a physical behavior of each tire and involving a first subset of the set of physical parameters;
(c) developing a vehicle model involving both the tire model and a second subset of the set of physical parameters, and describing a physical behavior of the vehicle as a function of at least tire stresses comprising slips and drifts;
(d) dividing the digital image of the predefined route into adjacent successive segments in the actual course direction, each comprising a set of at least three route points including an initial point and an end point of said segment in succession in this order in the actual course direction, the end point being located in an incoming bend;
(e) respectively associating vehicle speed limit values with the initial and end points of each successive segment;
(f) selecting, as an active configuration, a first tire configuration;
(g) selecting, as an active segment, a first route segment;
(h) simulating, by the vehicle model, the course of at least a first portion of the active route segment, from the initial point thereof, by the vehicle fitted with the active tire configuration, by optimizing the tire stresses to maximize an acceleration applied to the vehicle from a limit speed associated with the initial point of said active segment;
(i) storing in memory vehicle speeds with various points of the first portion of the active segment and course times between said different points;
(j) selecting, as an active section of the active segment, the route portion defined between a first and second point of a pair of points of the active segment in succession in this order in the course direction, the second point of said pair consisting of the end point of the active segment;
(k) selecting, as a target speed, the limit speed associated with the second point of the active section;
(l) simulating, by the vehicle model, the course of the active section of the active segment by the vehicle fitted with the active tire configuration, by optimizing the tire stresses and the speed adopted by the vehicle at the first point of the active section to reach the second point of the active section at the target speed, while minimizing the course time on said active section;
(m) storing in memory the course time of the active section by the vehicle; storing in memory, as the limit speed, the vehicle speed at the first point of the active section; and storing in memory, as an element of a second portion of the active segment, the active section covered;
(n) verifying whether the vehicle limit speed at the first point of the active section exceeds the speed stored in memory in step (i), which is adopted at a same point by the vehicle during the course of the first portion of the active segment;
(o) selecting, as a new active section of the active segment if the vehicle limit speed at the first point of the active section does not exceed the speed stored in memory in step (i), a route portion located upstream, with respect to the course direction, from a chronologically previous active section, and defined between a first and a second point of a pair of points of the active segment in succession in this order in the course direction, the second point of said pair consisting of the first point of the chronologically previous active section, and repeating steps (k) to (n);
(p) storing in memory, as the total course time of the active segment, if the vehicle limit speed at the first point of the active section exceeds the speed stored in memory in step (i), a sum of the total course time on the second part of said active segment and course times stored in memory on a fraction of the first portion of said segment not overlapping with the second portion;
(q) selecting, as the new active segment, the route segment following a previously active segment in the course direction; and
(r) repeating steps (h) to (q) until the route is covered at least once and a cumulative and stabilized course time by the vehicle is obtained.

4. The method according to claim 3, further comprising the steps of:
(s) selecting, as the new active configuration, a second tire configuration;
(t) repeating steps (g) to (r);
(u) comparing the cumulative and stabilized route times, respectively obtained with the first and second tire configuration; and
(v) selecting, as the optimized configuration, the tire configuration resulting in the shortest cumulative and stabilized course time of the route, the course time obtained with each tire configuration thus serving as a reference time for the course time obtained with the other tire configuration.

5. The method according to claim 3, wherein the tire model is a thermomechanical model, wherein step (j) is preceded by a step (w0) consisting of selecting, as active thermal conditions, predefined thermal conditions, wherein step (l) is performed by applying the active thermal conditions to the tires, wherein step (m) includes the further basic operation consisting of storing in memory the tire stresses on each active section, and wherein step (p) is immediately preceded by an iteration loop comprising the steps of:
(w1) in an event of a successful verification performed in step (n), simulating by the vehicle model the course by said vehicle fitted with the active tire configuration, active section after active section in the course direction, of the second portion of the active segment, by applying to the tires on each active section the stresses stored in memory in step (m) for said active section, and deducing new thermal conditions of use of the tires on the second portion of the active segment;

(w2) verifying whether a difference between the new thermal conditions and the active thermal conditions is within a convergence limit; and (w3) storing in memory, as the active thermal conditions, the new thermal conditions and repeating steps (j) to (w2) if the difference between the new thermal conditions and the active thermal conditions is not within the convergence limit.

6. The method according to claim 3, wherein step (d) is implemented by setting the end point of each segment to a maximum curvature of a bend.

7. The method according to claim 3, comprising a further operation, implemented for each new course of the predefined route and consisting of moving the end point of each segment upstream, in a direction of a zone having less tire slip.

8. The method according to claim 3, wherein the tire model developed in step (b) describes the physical behavior of each tire fitted on the vehicle when driving on the ground, wherewith a tire tread has a contact area including at least one adherent contact zone and at least one slippery contact zone, wherein step (b) comprises at least modeling operations, wherein each simulation step (h, l, w1) comprises digital value allocation operations and resolution operations, wherein the modeling operations consist at least of defining, by applying physical laws that are at least one of known and/or and constructed by specific experimentation, and as the first model, a model of the longitudinal forces (Fx), transversal forces (Fy) and a self-alignment torque (Mz), transmitted by the tire between the ground and the vehicle, as a function of specific physical parameters, including an adherence coefficient and a shear modulus of the tire rubber, and as a function of dynamic parameters associated with the physical driving and usage conditions of the tire, the self-alignment torque being linked with the intensity of the longitudinal and transversal forces and the distribution thereof in the contact area, the allocation operations consisting at least of attributing, digital values to the dynamic parameters and the specific parameters, and the resolution operations consisting at least of deducing, using at least the first model and values attributed to the dynamic parameters and the specific physical parameters, the values of the longitudinal forces (Fx), transversal forces (Fy), and the self-alignment torque (Mz), wherein the modeling operations also comprise a definition, as the second model, of a local heating model expressing variations of a contact temperature of the tread with the ground from the entrance to the exit of the contact area following contact and slip of the tread with the ground, and the definition, as the third model, of an overall heating and thermal flow model, said third model expressing variations, over a period of at least one revolution, of a peripheral temperature of the tire tread and an internal temperature of the tire as a function of previously known or estimated values of the peripheral and internal temperatures, a thermal conduction coefficient of the tire tread, and thermodynamic component phenomena such as internal deformations experienced by the tire, heat exchanges between the tire and the environment thereof, and slip of the tire tread on the ground, wherein at least the adherence coefficient and the shear modulus are involved in the first model as variables or functions of the peripheral temperature and internal temperature, wherein the peripheral temperature value (Ts), obtained resolution operations relating to the third model, is used by resolution operations relating to the second model to account for a temperature dependency of the adherence coefficient, and wherein the internal temperature value (Ti), obtained by resolution operations relating to the third model, is used by resolution operations relating to the first model to account for a temperature dependency of the shear modulus of the tire rubber.

9. The method according to claim 8, wherein the first model includes equations associated with equilibrium conditions of basic shearing and slipping forces of the tire tread in the contact area, wherein said method comprises at least one iterative calculation phase consisting of a succession of calculation cycles, and wherein each calculation cycle comprises at least one resolution operation relating to the second model.

10. The method according to claim 9, wherein the first model is defined by considering that the contact area comprises a single adherent contact zone and a single slippery contact zone separated from each other by a transition point, wherein the first model comprises a system of equations expressed at least as a function of the dynamic parameters, specific parameters, and the abscissa (b) of the transition point, wherein each iterative phase is dedicated to phenomena occurring during a corresponding basic time interval, and wherein each iterative phase is implemented to resolve, by successive approximations and at least based on previously known or estimated values of the abscissa (bo) of the transition point, transversal forces (Fyo), and the self-alignment torque (Mzo), new values of the abscissa (b) of the transition point, the transversal forces (Fy), and the self-alignment torque (Mz) which resolve the system of equations of the first model for the value attributed to the dynamic parameters and the specific parameters, with a result that the longitudinal forces, transversal forces, and the self-alignment torque of the tire may be calculated in real time when driving the vehicle.

11. The method according to claim 10, wherein each new calculation cycle of each iterative phase comprises operations comprising:

calculating a new provisional value of the abscissa of the transition point based on the equilibrium equations of basic forces and the previously known or estimated values of the transversal forces and the self-alignment torque;

calculating, based on the new provisional value of the abscissa of the transition point and equations linking the transversal forces and the self-alignment torque with the dynamic parameters, specific parameters, and the abscissa of the transition point, new values of the transversal forces and the self-alignment torque that can be used for any subsequent calculation cycle;

conditionally interrupting said iterative phase at least when a difference between the new provisional value of the abscissa of the transition point and the previously known or estimated value of said abscissa is less than a predefined limit of precision; and when said iterative phase is interrupted, assigning the longitudinal and transversal forces and the self-alignment torque, as values for this phase, the new values of the longitudinal and transversal forces and the self-alignment torque obtained in a final calculation cycle.

12. The method according to claim 10, further comprising an implementation operation after an end of each iterative phase and comprising updating the dynamic parameters to account for variations experienced by said parameters during a time of execution of each iterative phase, and initiating a new iterative phase.

13. The method according to claim 8, wherein the resolution operations relating to the third model are performed outside each iterative phase.

14. The method according to claim 8, wherein each of the first, second and third models are processed for each tire and associated with a dynamic chassis model, wherein the dynamic chassis model provides the first, second and third models, for each tire, with values of at least some of the dynamic parameters, and wherein the dynamic chassis model processes, for each tire, values of the longitudinal forces, the transversal forces and the self-alignment torque obtained using the first, second and third models.

* * * * *